(12) United States Patent
Nakamura et al.

(10) Patent No.: US 7,453,101 B2
(45) Date of Patent: Nov. 18, 2008

(54) SEMICONDUCTOR DEVICE WITH ORGANIC COMPOUND LAYER

(75) Inventors: Osamu Nakamura, Kanagawa (JP); Hideaki Kuwabara, Kanagawa (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 275 days.

(21) Appl. No.: 11/028,536

(22) Filed: Jan. 5, 2005

(65) Prior Publication Data

US 2005/0116227 A1    Jun. 2, 2005

Related U.S. Application Data

(62) Division of application No. 10/430,443, filed on May 7, 2003, now Pat. No. 7,115,956.

(30) Foreign Application Priority Data

May 15, 2002    (JP)    .............................. 2002-140743

(51) Int. Cl.
*H01L 21/04*    (2006.01)
(52) U.S. Cl. .......... 257/99; 257/E51.019; 257/E33.062; 257/E33.064
(58) Field of Classification Search ................... 257/99, 257/E51.019, E33.062, E33.064
See application file for complete search history.

(56) References Cited

U.S. PATENT DOCUMENTS

| | | | |
|---|---|---|---|
| 5,576,858 A | 11/1996 | Ukai et al. |
| 5,643,826 A | 7/1997 | Ohtani et al. |
| 5,663,589 A | 9/1997 | Saitoh et al. |
| 5,701,167 A | 12/1997 | Yamazaki |
| 5,748,165 A | 5/1998 | Kubota et al. |
| 5,889,291 A | 3/1999 | Koyama et al. |
| 5,923,962 A | 7/1999 | Ohtani et al. |
| 5,990,555 A | 11/1999 | Ohori et al. |

(Continued)

FOREIGN PATENT DOCUMENTS

CN    1311522    9/2001

(Continued)

OTHER PUBLICATIONS

Chinese Office Action (Application No. 03141000.6 CN6415 dated Mar. 2, 2007).

*Primary Examiner*—George Fourson
(74) *Attorney, Agent, or Firm*—Fish & Richardson P.C.

(57) ABSTRACT

In the manufacture of a semiconductor device, there are provided a method that enables reduction in the number of manufacturing steps thereof and a structure for realizing the method, to thereby realize improvement in yield and reduction in manufacturing cost. Wirings (source wiring, drain wiring, and the like), which are respectively formed in a row direction and a column direction on an element substrate, are formed of the same conductive film. In this case, one of the respective wirings in the row direction and the column direction is discontinuously formed at a portion where the wirings intersect with each other, and an insulating film is formed on the wirings. Thereafter, a connection wiring for connecting discontinuous wirings is formed of the same film as that for forming an electrode provided on the insulating film. As a result, a continuous wiring is formed.

9 Claims, 17 Drawing Sheets

U.S. PATENT DOCUMENTS

| | | | |
|---|---|---|---|
| 5,990,998 | A | 11/1999 | Park et al. |
| 6,031,290 | A | 2/2000 | Miyazaki et al. |
| 6,067,062 | A | 5/2000 | Takasu et al. |
| 6,078,366 | A | 6/2000 | Dohjo et al. |
| 6,084,461 | A | 7/2000 | Colbeth et al. |
| 6,091,194 | A * | 7/2000 | Swirbel et al. ............... 313/498 |
| 6,107,983 | A | 8/2000 | Masuda et al. |
| 6,169,391 | B1 | 1/2001 | Lei |
| 6,191,408 | B1 | 2/2001 | Shinotsuka et al. |
| 6,208,395 | B1 | 3/2001 | Kanoh et al. |
| 6,225,966 | B1 | 5/2001 | Ohtani et al. |
| 6,372,558 | B1 | 4/2002 | Yamanaka et al. |
| 6,426,245 | B1 | 7/2002 | Kawasaki et al. |
| 6,456,350 | B1 | 9/2002 | Ashizawa et al. |
| 6,461,899 | B1 * | 10/2002 | Kitakado et al. ............ 438/149 |
| 6,465,806 | B2 | 10/2002 | Kubota et al. |
| 6,489,222 | B2 | 12/2002 | Yoshimoto |
| 6,492,659 | B1 | 12/2002 | Yamazaki et al. |
| 6,498,596 | B1 | 12/2002 | Nakamura et al. |
| 6,524,877 | B1 * | 2/2003 | Nakazawa et al. ............ 438/48 |
| 6,624,013 | B2 | 9/2003 | Kawasaki et al. |
| 6,670,225 | B2 | 12/2003 | Ohnuma |
| 6,677,221 | B2 | 1/2004 | Kawasaki et al. |
| 6,690,033 | B2 * | 2/2004 | Yamazaki et al. ............. 257/72 |
| 6,746,901 | B2 | 6/2004 | Kasahara |
| 6,762,081 | B2 | 7/2004 | Yamazaki et al. |
| 6,844,249 | B2 | 1/2005 | Kawasaki et al. |
| 6,909,409 | B2 | 6/2005 | Tanada |
| 7,064,016 | B2 | 6/2006 | Kasahara |
| 2001/0017372 | A1 | 8/2001 | Koyama |
| 2001/0025959 | A1 * | 10/2001 | Yamazaki et al. ............. 257/72 |
| 2001/0030322 | A1 | 10/2001 | Yamazaki et al. |
| 2002/0110941 | A1 | 8/2002 | Yamazaki et al. |
| 2002/0158288 | A1 | 10/2002 | Yamazaki et al. |
| 2003/0214006 | A1 | 11/2003 | Nakamura et al. |
| 2004/0135181 | A1 | 7/2004 | Yamazaki |
| 2005/0237286 | A1 | 10/2005 | Tanada |
| 2006/0246634 | A1 | 11/2006 | Kasahara |

FOREIGN PATENT DOCUMENTS

| | | |
|---|---|---|
| CN | 1341970 | 3/2002 |
| EP | 1 054 452 | 11/2000 |
| EP | 1 128 430 A2 | 8/2001 |
| EP | 1 128 439 | 8/2001 |
| EP | 1 130 566 | 9/2001 |
| JP | 06-148685 | 5/1994 |
| JP | 06-281957 | 10/1994 |
| JP | 07-235680 | 9/1995 |
| JP | 08-274336 | 10/1996 |
| JP | 09-160509 | 6/1997 |
| JP | 10-048640 | 2/1998 |
| JP | 2001-053285 | 2/2001 |
| JP | 2001-085703 | 3/2001 |
| JP | 2001-313397 | 11/2001 |
| JP | 2001-318624 | 11/2001 |
| JP | 2001-318628 | 11/2001 |
| JP | 2001-345267 | 12/2001 |
| JP | 2002-016256 | 1/2002 |
| JP | 2002-033330 | 1/2002 |
| JP | 2002-040990 | 2/2002 |
| JP | 2002-043578 | 2/2002 |

* cited by examiner

SEMICONDUCTOR DEVICE WITH ORGANIC COMPOUND LAYER

CROSS-REFERENCE TO RELATED APPLICATIONS

This application is a divisional application of U.S. application Ser. No. 10/430,443, filed May 7, 2003, now U.S. Pat. No. 7,115,956, which claims the benefit of a foreign priority application filed in Japan as Ser. No. 2002-140743 on May 15, 2002. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device having a circuit composed of a thin film transistor (hereinafter referred to as TFT) and a manufacturing method thereof. More specifically, electro-optical devices typified by liquid crystal display devices and light emitting devices having light emitting elements and also, electrical equipment in which such devices are mounted as parts will be included in this category.

2. Description of the Related Art

In recent years, techniques of forming thin film transistors (TFTs) by using semiconductor films (of about several to several hundreds of nm in thickness) formed on a substrate having an insulating surface have been attracting attention. Thin film transistors are widely applied to electronic devices such as ICs and electro-optical devices, and especially, the development thereof as switching elements for display devices is being hastened.

Note that as display devices, liquid crystal display devices, light emitting devices and the like are known. In such display devices, driving methods such as passive matrix driving (simple matrix type) and active matrix driving (active matrix type) can be used. However, in the case where the pixel density is increased, the active matrix type in which a switch is provided for each pixel (or one dot) is considered to be advantageous in that a low voltage driving can be conducted.

In an active matrix liquid crystal display device, a display pattern is formed on a screen by driving pixel electrodes arranged in matrix. To be specific, a voltage is applied between a selected pixel electrode and an opposing electrode thereof, whereby optical modulation of a liquid crystal layer arranged between the pixel electrode and the opposing electrode is performed. Thus, the optical modulation is recognized as the display pattern by an observer.

Further, an active matrix light emitting device that uses organic electroluminescence has, in each pixel thereof, at least a TFT that functions as a switching element and a TFT that supplies a current to a light emitting element formed by sandwiching an organic compound layer between a pair of electrodes, and utilizes light emission obtained through recombination of carriers in the organic compound layer. Note that the light emitting device is expected to be applied to next-generation flat panel displays because of its features such as thinness and lightness, high-speed responsibility, and direct low-voltage drive. In particular, the light emitting device is considered to hold its superiority in a point that the device has a wider angle of view and excellent visibility compared with a conventional liquid crystal display device.

In a pixel structure in a liquid crystal display device, three of a gate wiring (scanning line), a source wiring (signal line), and a capacitor wiring each are patterned into a line shape. In this case, one of the source wiring and the gate wiring is arranged in a row direction while the other is arranged in a column direction, and plural pixels are formed in a region surrounded by both the wirings. Further, in order that both the wirings may not contact with each other at a portion where the wirings intersect with each other, the gate wiring and the source wiring are respectively comprised of conductive films formed at different layers through an insulating film. That is, there is provided such a structure in which the insulating film is formed between one of the source wiring and the gate wiring, which is formed of a first conductive film, and the other of the source wiring and the gate wiring, which is formed of a second conductive film.

On the other hand, in a pixel structure in a light emitting device, three of a gate wiring (scanning line), a source wiring (signal line), and a current supply line each are patterned into a line shape. In this case, one of the source wiring and current supply line and the gate wiring is arranged in a row direction while the other is arranged in a column direction, and plural pixels are formed in a region surrounded by the source wiring, the current supply line and the gate wiring. Further, in order that both the wirings may not contact with each other at a portion where the wirings intersect with each other, the gate wiring and the source wiring and current supply line are respectively comprised of conductive films formed at different layers through an insulating film. That is, there is provided such a structure in which the insulating film is formed between one of the source wiring and current supply line and the gate wiring, which is formed of a first conductive film, and the other of the source wiring and current supply line and the gate wiring, which is formed of a second conductive film.

However, application of such active matrix display devices (typically, liquid crystal display device and light emitting device) has been expanding, and the needs for high fineness, a high aperture ratio, and high reliability have been growing along with an increase in surface area of a screen. As a result, the needs for improvement in productivity and reduction in cost also have been growing.

SUMMARY OF THE INVENTION

The present invention has been made in view of the above, and therefore has an object to provide, in the manufacture of a semiconductor device, a method that enables reduction in the number of manufacturing steps thereof and a structure for realizing the method, to thereby realize improvement in yield and reduction in manufacturing cost.

In order to attain the above object, the present invention is characterized in that wirings, which are formed of two types of conductive films in the prior art, are formed of only one type of conductive film, thereby reducing the number of steps in the manufacture of a semiconductor device.

Specifically, in the manufacture of a semiconductor device, wirings (source wiring, drain wiring, and the like), which are respectively formed in a row direction and a column direction on an element substrate, are formed of the same conductive film. In this case, one of the respective wirings in the row direction and the column direction is discontinuously formed at a portion where the wirings intersect with each other, and an insulating film is formed on the wirings. Thereafter, a connection wiring for connecting the discontinuous wirings is formed of the same film as that for an electrode (hereinafter also referred to as first electrode) formed on the insulating film and through an opening portion (contact hole) formed in the insulating film. As a result, a continuous wiring can be obtained.

In this way, all the wirings can be formed by using only one type of conductive film. Thus, compared with the case where the wirings are formed by using two types of conductive films laminated through an insulating film, the number of film deposition steps of a conductive film can be reduced, and in addition, the number of photolithography steps in patterning can be reduced.

Further, the connection wiring for connecting discontinuously formed wirings can be formed of the same conductive film as that for forming the electrode through the same patterning step. Therefore, the connection wiring can be formed without an increase in the number of steps.

According to the present invention, the source wiring is a wiring for inputting an image signal from a source side driver circuit to a source (source region) of a TFT formed in a pixel portion. The gate wiring is a wiring for inputting a signal, which is for selecting the TFT formed in the pixel portion, to a gate electrode from a gate side driver circuit. Further, the present invention is characterized in that the source wiring and the gate wiring are formed of the same material on the same surface at one time. In addition, as the occasion demands, a capacitor wiring and the like can be formed simultaneously with the source wiring and the gate wiring.

Further, among the above wirings, the connection wiring for connecting discontinuously formed wirings is formed simultaneously with the electrode electrically connected with the TFT. That is, the TFT, all the wirings, and the electrode are formed without increasing the conventional number of steps.

According to a structure of the present invention manufactured as described above, a semiconductor device is characterized by including: a semiconductor layer which has a source (source region), a drain (drain region), and a channel region (channel formation region) as parts thereof; a gate insulating film formed on the semiconductor layer; a source wiring formed on the gate insulating film; a gate electrode which is provided on the gate insulating film and formed at a position where the gate electrode overlaps the channel region; an insulating film formed on the source wiring and the gate electrode; and a connection wiring and an electrode which are formed on the insulating film, in which: the connection wiring is formed in opening portions formed in the insulating film and in the gate insulating film, and establishes electrical connection between the source wiring and the source; and the connection wiring and the electrode are formed of the same material on the same film deposition surface.

Further, according to another structure of the present invention, a semiconductor device is characterized by including: a semiconductor layer which has a source, a drain, and a channel region as parts thereof; a gate insulating film formed on the semiconductor layer; a source wiring formed on the gate insulating film; a gate electrode which is provided on the gate insulating film and formed at a position where the gate electrode overlaps the channel region; an insulating film formed on the source wiring and the gate electrode; and a connection wiring and an electrode which are formed on the insulating film, in which: the connection wiring is formed in opening portions formed in the insulating film and in the gate insulating film, and establish electrical connection between the source wiring and the source; the electrode is electrically connected with the drain; and the connection wiring and the electrode are formed of the same material on the same film deposition surface.

Further, according to the present invention, in the case where plural island-like conductive films (gate lines), which are discontinuously formed, are to be formed into a continuous wiring, the island-like conductive films (gate lines) are electrically connected with the connection wiring, thereby forming the gate wiring.

On the other hand, in the case where plural island-like conductive films (source lines), which are discontinuously formed, are to be formed into a continuous wiring, the island-like conductive films (source lines) are electrically connected with the connection wiring, thereby forming the source wiring.

Further, in each of the above structures, examples of materials for forming the first electrode may include: ITO and IZO, which are transparent conductive films; elements such as gold (Au), platinum (Pt), nickel (Ni), tungsten (W), chromium (Cr), iron (Fe), aluminum (Al), tantalum (Ta), and titanium (Ti); and compounds of the above elements.

Moreover, in each of the above structures, the electrode formed on the same surface as that for the connection wiring serves as the first electrode, an organic compound layer is formed on the first electrode, and further, a second electrode is formed on the organic compound layer. As a result, there can be formed a light emitting element including the electrodes as a part thereof.

That is, according to another structure of the present invention, a semiconductor device is characterized by including: first and second semiconductor layers each of which has a source, a drain, and a channel region as parts thereof; a gate insulating film formed on the first and second semiconductor layers; a source wiring and a current supply line which are formed on the gate insulating film; first and second gate electrodes which are provided on the gate insulating film and respectively formed at positions where the first and second gate electrodes overlap the channel regions of the respective first and second semiconductor layers; an insulating film formed on the source wiring, the current supply line, the first gate electrode, and the second gate electrode; plural connection wirings and a first electrode which are formed on the insulating film; an organic compound layer formed on the first electrode; and a second electrode formed on the organic compound layer, and the semiconductor device in which: the plural connection wirings are formed in opening portions formed in the insulating film and in the gate insulating film, and establish electrical connections between the source wiring and the source of the first semiconductor layer, between the drain of the first semiconductor layer and the second gate electrode, and between the current supply line and the source of the second semiconductor layer; the first electrode is electrically connected with the drain of the second semiconductor layer; and the connection wirings and the first electrode are formed of the same material on the same film deposition surface.

Further, according to the present invention, particularly in the case where the transparent conductive film such as ITO or IZO is used, it is preferable that wet etching is used as a method of patterning the connection wiring and the first electrode. This is because the characteristics of the TFT, which is previously formed, are not influenced by plasma damage in the case of using dry etching. Note that it is particularly effective that wet etching is adopted in the case where the insulating film, which is formed between the TFT and the connection wiring and first electrode, is formed of an organic insulating material.

Further, according to the present invention, there is provided a method of manufacturing a semiconductor device having the above structures, characterized by including: forming a semiconductor layer on an insulating surface; forming a gate insulating film on the semiconductor layer; forming a source wiring on the gate insulating film; forming a gate electrode on the gate insulating film and at a position where the gate electrode overlaps a part of the semiconductor layer; forming a source and a drain through doping of impurities into the semiconductor layer with the gate electrode serving as a mask; forming an insulating film to cover the gate electrode and the source wiring; forming a connection wiring and an electrode, which are formed of the same material and on the same film deposition surface, on the insulating film; and electrically connecting the source wiring with the source through the connection wiring.

Further, according to another structure of the present invention, a method of manufacturing a semiconductor device is characterized by including: forming a semiconductor layer on an insulating surface; forming a gate insulating film on the semiconductor layer; forming a source wiring on the gate insulating film; forming a gate electrode on the gate insulating film and at a position where the gate electrode overlaps a part of the semiconductor layer; forming a source and a drain through doping of impurities into the semiconductor layer with the gate electrode serving as a mask; forming an insulating film to cover the gate electrode and the source wiring; forming a connection wiring and an electrode, which are formed of the same material and on the same film deposition surface, on the insulating film; electrically connecting the source wiring with the source through the connection wiring; and electrically connecting the electrode with the drain.

Further, in each of the above structures, it is characterized in that the connection wiring and the electrode are formed by wet etching.

DETAILED DESCRIPTION OF THE PREFERRED EMBODIMENTS

Embodiment modes of a semiconductor device of the present invention will be described below.

Semiconductor devices according to the present invention include liquid crystal display devices and light emitting devices, and in any case, an element substrate is formed with a structure in which plural thin film transistors and electrodes are provided on a substrate. In the case of the liquid crystal display device, an opposing substrate is bonded to the element substrate with a predetermined gap therebetween, and an electro-optical substance (liquid crystal material, etc.) is provided in the gap, whereby a liquid crystal panel is formed. In the case of the light emitting device, a light emitting element is formed by laminating an organic compound layer and a second electrode on an electrode (first electrode) of the element substrate, whereby a light emitting panel is obtained.

According to the present invention, a connection structure of wirings can be formed which is as shown in FIGS. 1A to 1C or FIGS. 2A to 2C.

Figure 1A:
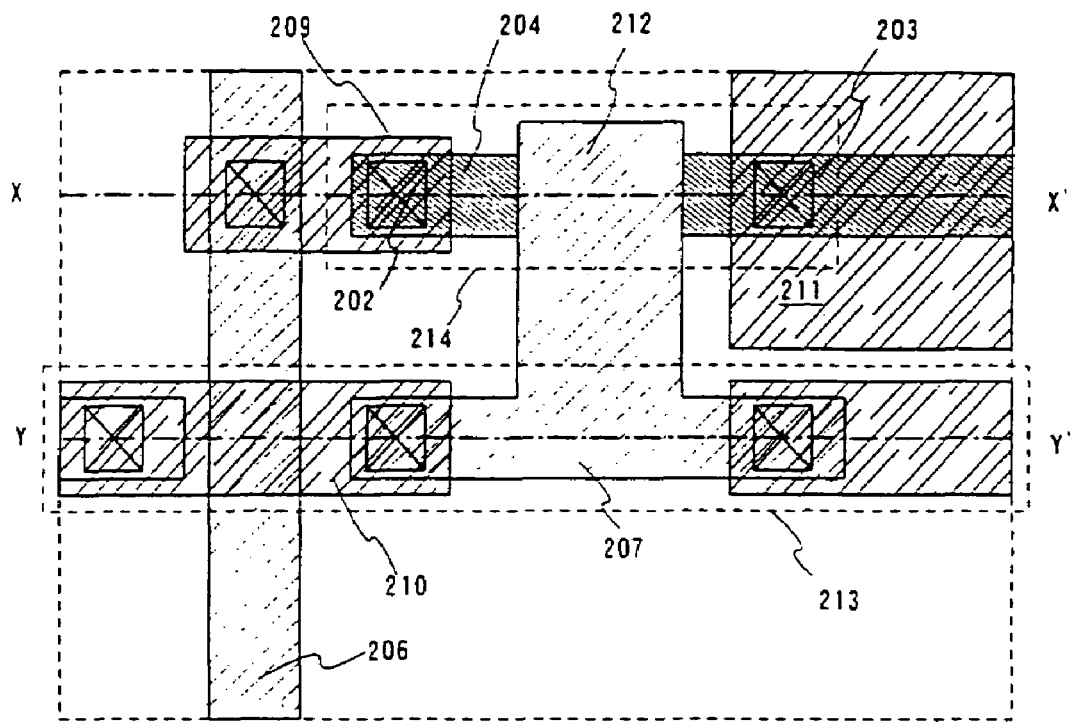
FIGS. 1A to 1C are views for explaining a connection relationship among wirings according to the present invention.
Figure 1B:
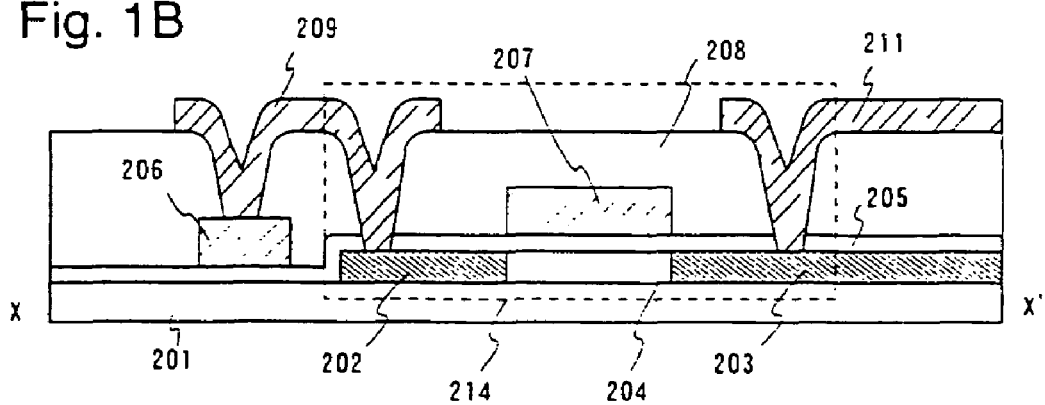
Figure 1C:
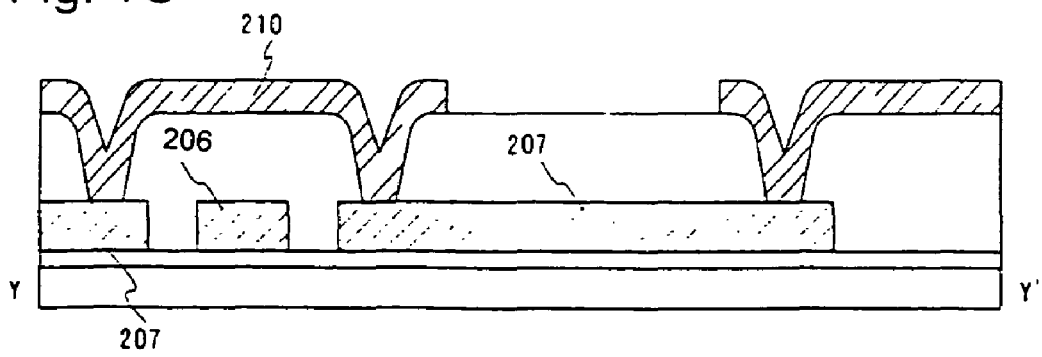

FIGS. 1A to 1C show a structure that includes a TFT, a source wiring, a gate wiring (including a gate electrode), and a first electrode electrically connected with the TFT, which are formed on a substrate. The present invention is characterized in that the above structural elements are formed of only two types of conductive films and connected with one another. Note that FIG. 1B is a sectional view taken along a broken line X-X' in a top view of FIG. 1A, and FIG. 1C is a sectional view taken along a broken line Y-Y' in the top view of FIG. 1A.

As shown in FIG. 1B, a semiconductor layer 204, which forms a source 202 and a drain 203 of the TFT, is formed on a substrate 201. Then, on the semiconductor layer 204, a source wiring 206 and a gate line 207, which are formed of a first conductive film, are formed on a gate insulating film 205 by performing patterning. Note that the source wiring 206 is formed in line so as to be electrically connected with all the pixels formed in a column direction in a pixel portion of the element substrate although this is not shown in the figure. On the other hand, the gate line 207 is formed to have an island shape and independently for each pixel. Further, the portion which is a part of the gate line 207 and which overlaps the semiconductor layer 204 corresponds to a gate electrode 212 of a TFT 214.

Further, connection wirings 209 and 210 and a first electrode 211, which are formed of a second conductive film, are formed on the source wiring 206 and the gate line 207 through an insulating film 208 by performing patterning.

The connection wiring 209 electrically connects the source wiring 206 with the source 202 through contact holes (not shown in the figure) formed in the insulating film 208 as shown in FIG. 1B, and also, the connection wiring 210 establishes electrical connection with respect to the gate lines 207, which are formed into plural island shapes, through contact holes as shown in FIG. 1C. Thus, electrical connection of the island-like gate lines 207 is established with the connection wiring 210, whereby a gate wiring 213 is formed. Further, the gate wiring 213 is electrically connected with all the pixels formed in the column direction in the pixel portion of the element substrate.

Figure 2A:
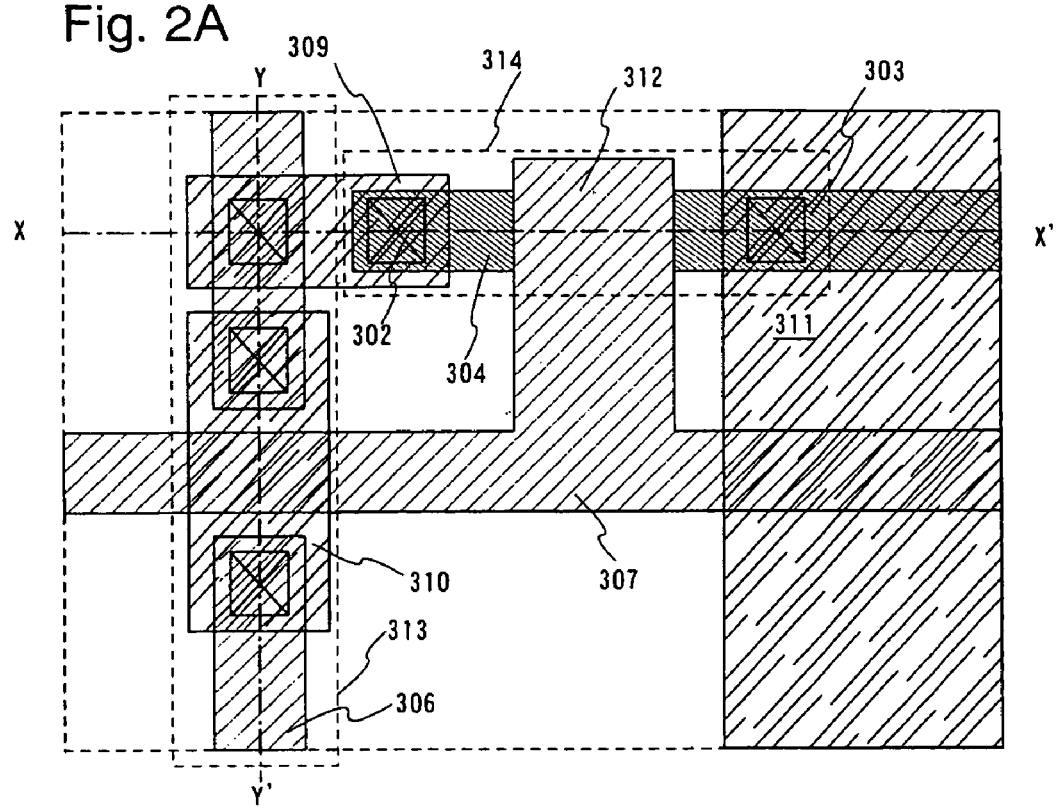
FIGS. 2A to 2C are views for explaining a connection relationship among wirings according to the present invention.
Figure 2B:
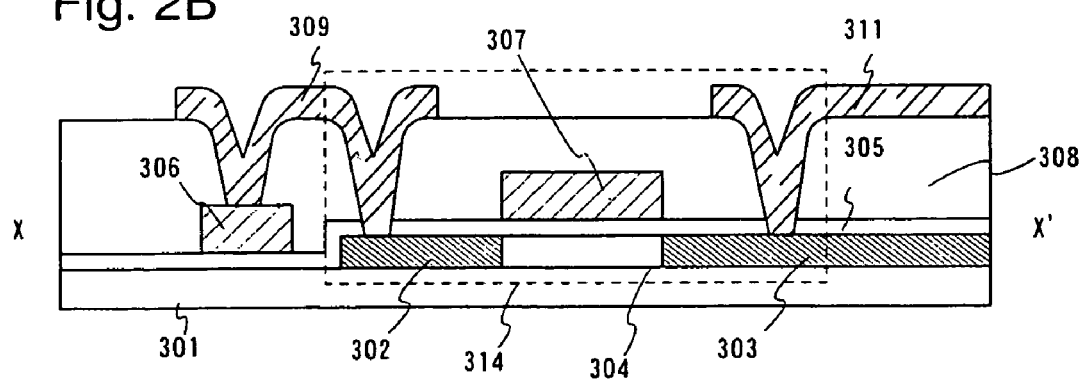
Figure 2C:
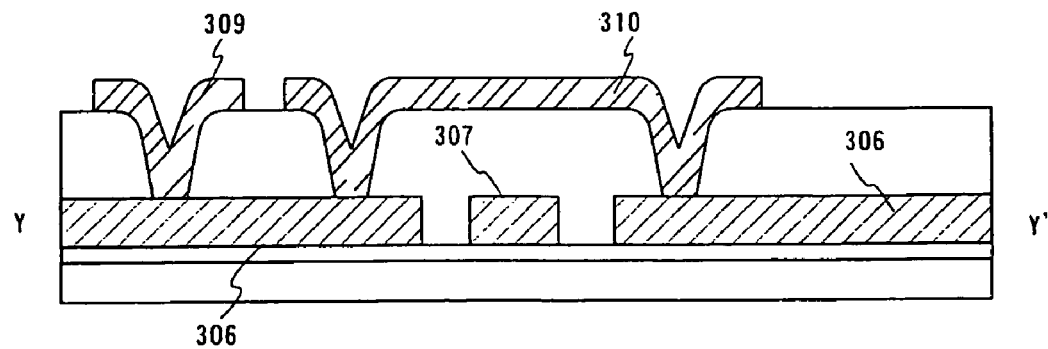

Further, FIGS. 2A to 2C show a case where source lines, which are formed of a first conductive film and are formed in island shapes, are in contact with connection wirings formed of a second conductive film, differently from the case of FIGS. 1A to 1C. Note that FIG. 2B is a sectional view taken along a broken line X-X' in a top view of FIG. 2A, and FIG. 2C is a sectional view taken along a broken line Y-Y' in the top view of FIG. 2A.

Similarly, a semiconductor layer 304, which forms a source 302 and a drain 303 of a TFT, is formed on a substrate 301. Then, on the semiconductor layer 304, a source line 306 and a gate wiring 307, which are formed of the first conductive film, are formed through a gate insulating film 305 by performing patterning. Further, the portion which is a part of the gate wiring 307 and which overlaps the semiconductor layer 304 corresponds to a gate electrode 312 of a TFT 314. Note that the gate wiring 307 is formed in line so as to be electrically connected with all the pixels formed in a row direction in a pixel portion of the element substrate although this is not shown in the figure. On the other hand, the source line 306 is formed to have an island shape and independently for each pixel.

Further, connection wirings 309 and 310 and a first electrode 311, which are formed of a second conductive film, are formed on the source line 306 and the gate wiring 307 through an insulating film 308 by performing patterning.

The connection wiring 309 electrically connects the source line 306 with the source 302 through contact holes (not shown in the figure) formed in the insulating film 308 as shown in FIG. 2B, and also, the connection wiring 310 establishes electrical connection with respect to the source lines 306, which are formed into plural island shapes, through contact holes as shown in FIG. 2C. Thus, electrical connection of the island-like source lines 306 is established with the connection wiring 310, whereby a source wiring 313 is formed. Further, the source wiring 313 is electrically connected with all the pixels formed in a column direction in the pixel portion of the element substrate.

Embodiment Mode 1

In Embodiment Mode 1, description will be made of a structure of an element substrate having plural TFTs, wirings, and electrodes formed on a substrate, and is finally formed into a liquid crystal display device. Note that FIG. 3 shows a structure of a pixel portion of the element substrate.

Figure 3:
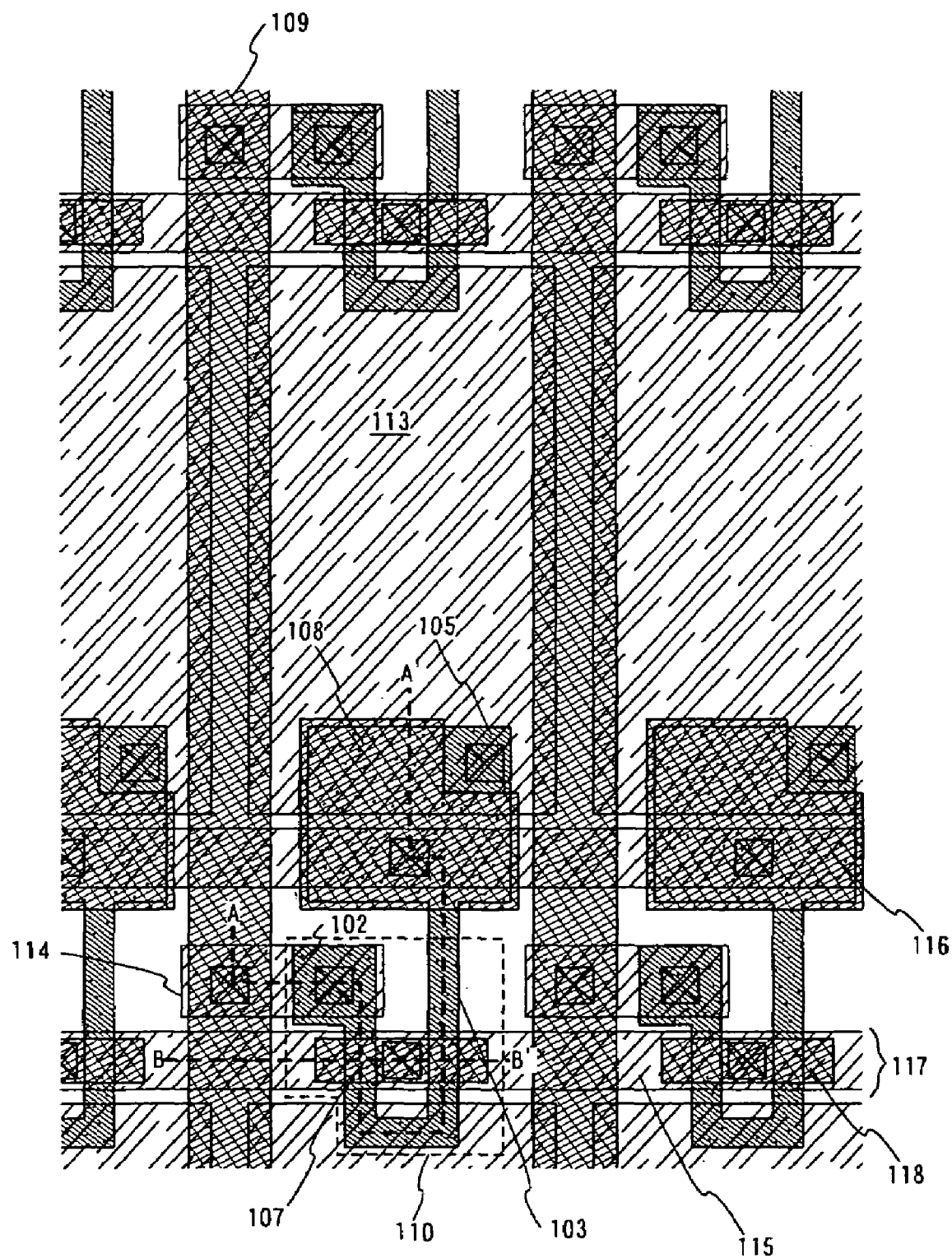
FIG. 3 is a view for explaining an element substrate that is manufactured according to the present invention.

As shown in FIG. 3, the element substrate explained in Embodiment Mode 1 includes a pixel portion that has: a gate wiring 117 and a capacitor wiring 116, which are arranged in a row direction; a source wiring 109 arranged in a column direction; a TFT 110 formed in the vicinity of an intersecting portion of the gate wiring and the source wiring; and an electrode (first electrode) and a driver circuit which has an n-channel TFT and a p-channel TFT and which is not shown in the figure here.

The gate wiring 117 in FIG. 3 is obtained by establishing electrical connection of an island-like gate line 118 arranged in the row direction with a connection wiring 115, and the island-like gate line 118 is formed to come in contact with a gate insulating film similarly to the source wiring 109 (including a gate electrode 107) and a capacitor electrode 108. Further, a connection wiring 114 and a first electrode 113 are formed on first and second insulating films (interlayer insulating films), and the connection wiring 114 electrically connects the source wiring 109 with a source 102 of the TFT 110. Note that the first electrode 113 is electrically connected with a drain 103 of the TFT 110.

With the above-described structure, the first electrode 113, the connection wirings 114 and 115, and the capacitor wiring 116 all can be formed on the same film deposition surface at one time.

Further, a holding capacitor of the first electrode 113 is constituted of a semiconductor layer 105 connected with the first electrode 113 and the capacitor electrode 108 electrically connected with the capacitor wiring 116 with an insulating film (gate insulating film), which covers the semiconductor layer 105, serving as a dielectric.

According to the present invention, there can be set as equal to five the number of masks necessary for forming the element substrate that includes the pixel portion having the pixel structure shown in FIG. 3 and the driver circuit. That is, the first mask is for patterning the semiconductor layer 105; the second mask is for patterning the source wiring 109, the capacitor electrode 108, and the island-like gate line 118; the third mask is for covering the n-channel TFT in doping of impurities imparting p-type conductivity for the formation of the p-channel TFT of the driver circuit; the fourth mask is for forming contact holes that respectively reach the semiconductor layer 105, the island-like gate line 118, and the source wiring 109; and the fifth mask is for patterning the first electrode 113, the connection wirings 114 and 115, and the capacitor wiring 116.

As described above, the element substrate can be formed with a small number of masks in the case of the pixel structure shown in FIG. 3.

Embodiment Mode 2

In Embodiment Mode 2, description will be made of a structure of an element substrate, which is different from the structure described in Embodiment Mode 1 and is finally formed into a light emitting device. Note that FIG. 8 particularly shows a structure of a pixel portion of the element substrate.

Figure 8:
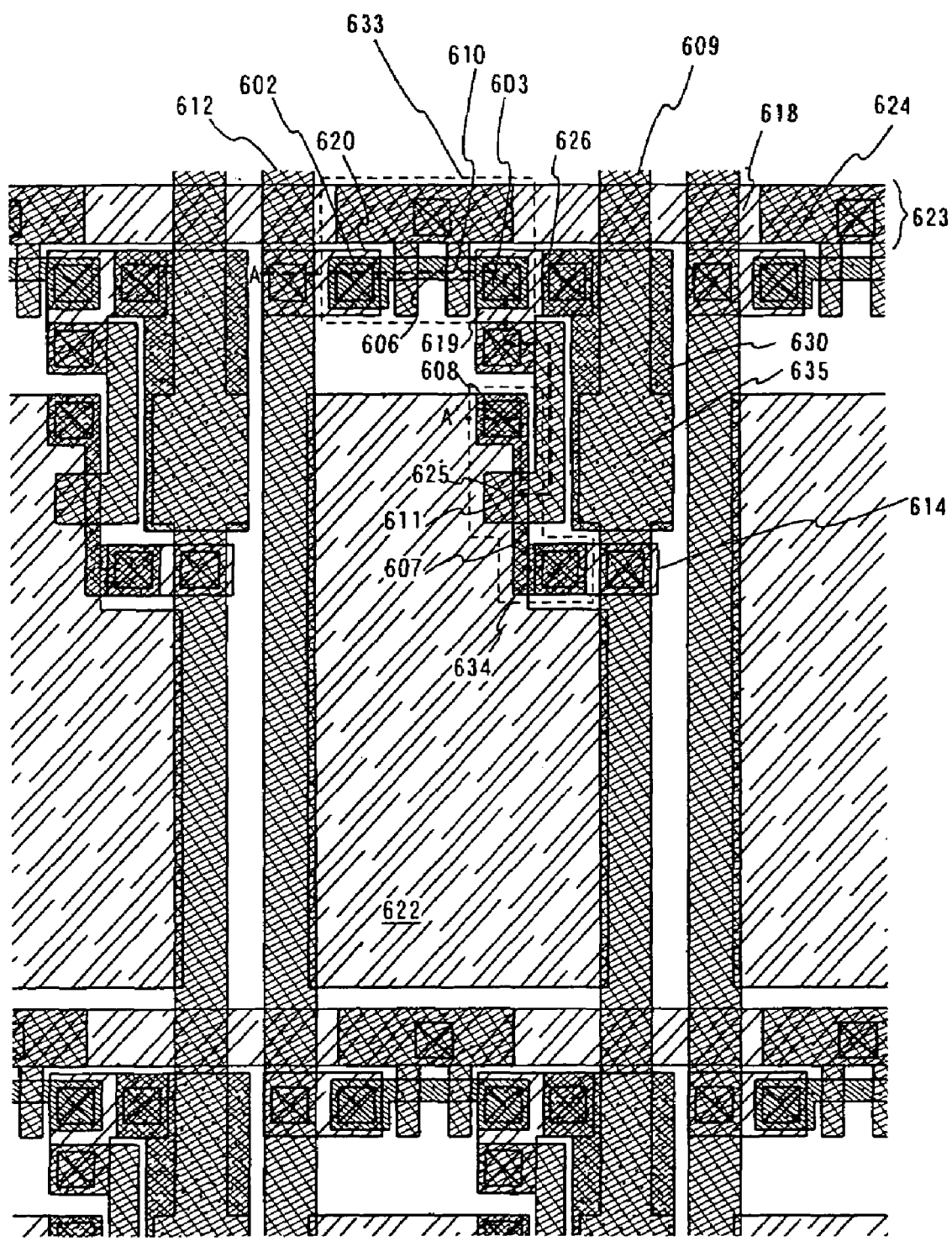
FIG. 8 is a view for explaining an element substrate that is manufactured according to the present invention.

As shown in FIG. 8, the element substrate includes a pixel portion that has: a gate wiring 623 arranged in a row direction; a source wiring 612 and a current supply line 609 which are arranged in a column direction; TFTs (switching TFT 633 and current control TFT 634) formed in the vicinity of an intersecting portion of the gate wiring 623 and the source wiring 612; and electrodes and a driver circuit which has an n-channel TFT and a p-channel TFT and which is not shown in the figure here.

The gate wiring 623 shown in FIG. 8 indicates the wiring obtained by establishing electrical connection of an island-like gate line (1) 624 arranged in the row direction with a connection wiring 618. The island-like gate line (1) 624 (including a gate electrode (1) 610) is formed to come in contact with a gate insulating film similarly to the source wiring 612, the current supply line 609, and a gate line (2) 625 (including a gate electrode (2) 611). Further, connection wirings 614, 618, 619, and 620 are formed on first and second insulating films (interlayer insulating films) similarly to a first electrode 622. The connection wiring 614 electrically connects a drain of the current control TFT 634 with the current supply line 609. The connection wiring 619 establishes electrical connection among a drain 603 of the switching TFT 633, the gate electrode (2) 611 of the current control TFT 634, and a semiconductor layer (3) 630. The connection wiring 620 can electrically connect the source wiring 612 with a source 602 of the switching TFT 633.

With the above-described structure, the connection wirings (614, 618, 619, and 620) and the first electrode 622 all can be formed on the same film deposition surface at one time.

Further, as to a holding capacitor of the first electrode 622, a capacitor 635 is constituted of the semiconductor layer (3) 630 connected with the drain 603 of the switching TFT 633 and a part of the current supply line 609 with an insulating film (gate insulating film), which covers a semiconductor layer (2) 607, serving as a dielectric.

According to the present invention; there can be set at five the number of masks necessary for forming the element substrate that includes the pixel portion with the pixel structure shown in FIG. 8 and the driver circuit. That is, the first mask is for patterning the semiconductor layer (1) 606, the semiconductor layer (2) 607, and the semiconductor layer (3) 630; the second mask is for patterning the source wiring 612, the current supply line 609, the island-like gate line (1) 624, and the island-like gate line (2) 625; the third mask is for covering the n-channel TFT in doping of an impurity element imparting p-type conductivity for the formation of the p-channel TFT of the driver circuit; the fourth mask is for forming contact holes that respectively reach the semiconductor layer (1) 606, the semiconductor layer (2) 607, the island-like gate line (1) 624, the island-like gate line (2) 625, and the source wiring 612; and the firth mask is for patterning the connection wirings (614, 618, 619, and 620) and the first electrode 622.

As described above, the element substrate can be manufactured with a small number of masks in the case of the pixel structure shown in FIG. 8.

Embodiments

Embodiments of the present invention will be described below.

Embodiment 1

In this embodiment, a manufacturing method of an element substrate having a structure of a pixel portion structure described in Embodiment Mode 1 using FIG. 3, the pixel portion is formed simultaneously with forming an n-channel TFT and a p-channel TFT on a same substrate, is described with reference to FIGS. 4 to 7. In addition, FIG. 4 is a view of a cross-sectional structure of a pixel portion structure shown in FIG. 3 that is taken along a dotted line A-A'. Since symbols used in FIGS. 3 to 7 are common, it can be appropriately referenced with each other.

Glass substrates, plastic substrates, ceramic substrates, and the like can be used for the substrate 100. Further, metal substrates typified by silicon substrates or stainless steel substrates that is formed on its surface with an insulating film such as silicon oxide film or silicon nitride film may also be used. It is also possible, or course, to use quartz substrates.

A base film made from a silicon nitride film, and a base film 101 made from a silicon oxide film may be formed on a main surface of the substrate 100.

The base films 101 is formed by plasma CVD or sputtering, and provided in order to prevent impurities harmful to the TFTs from diffusing from the substrate 100 to semiconductor layers. The base film made from the silicon nitride film may therefore be formed having a thickness of 20 to 100 nm, typically 50 nm, and in addition, the base film made from the silicon oxide film may be formed having a thickness of 50 to 500 nm, typically between 150 and 200 nm.

Of course only one set of base film may also be formed, either the base film made from the silicon nitride film or the base film made form the silicon oxide film. However, considering TFT reliability, it is found that using a two-layer structure is most preferable.

Next, an amorphous semiconductor film is formed on the base film 101 by using a film formation method such as plasma CVD, low pressure CVD, or sputtering. The amorphous semiconductor films are formed having a thickness form 10 to 100 nm, typically 50 nm.

Silicon (Si), germanium (Ge), silicon germanium alloys, and silicon carbide can be used for the amorphous semiconductor films, and in addition, compound semiconductor materials such as gallium arsenide can also be used.

Furthermore, it is possible to form the base film and the amorphous semiconductor film by using the same deposition method, and therefore the base film 101, and in addition, the amorphous semiconductor film may be preferably formed in succession. Surface contamination can be prevented after forming the various films by making sure that the respective film deposition surfaces do not come into contact with the atmosphere. As a result, one cause of dispersion in the TFT characteristics can be eliminated.

Next, by crystallizing the amorphous semiconductor film using a known crystallization technique, a crystalline semiconductor film is formed in contact with the base film 101.

Hydrogen is contained in amorphous semiconductor films manufactured by plasma CVD at a ratio of 10 to 40 atom %, and it is preferable to eliminate hydrogen from the inside of the film, reducing the amount of hydrogen contained in the film to 5 atom % or less, by performing the beat treatment process at a temperature of 400 to 500° C. before the crystallization process. Further, the amorphous semiconductor films may also be formed by other film formation methods such as sputtering or evaporation, and it is preferable to sufficiently reduce the amount of impurities such as oxygen and nitrogen contained within the films.

Crystallization by a known solid state grown method such as laser annealing or thermal annealing may be performed for the process of crystallizing the amorphous semiconductor films. Further, crystalline semiconductor films made by a thermal annealing technique using a catalyst element can also be used. In addition, the superior TFT characteristics can be obtained for the crystalline semiconductor films formed by the thermal annealing technique using a catalyst element if a gettering step is added for removing the catalyst element.

Figure 5:
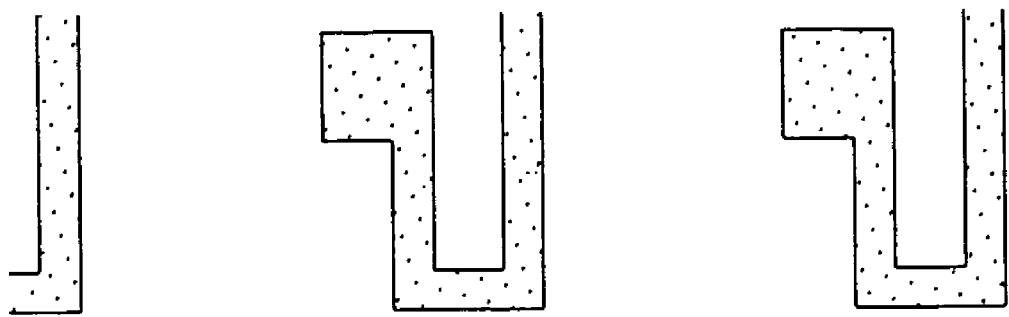
FIG. 5 is a top view for explaining a manufacturing step of the element substrate.
Figure 5:
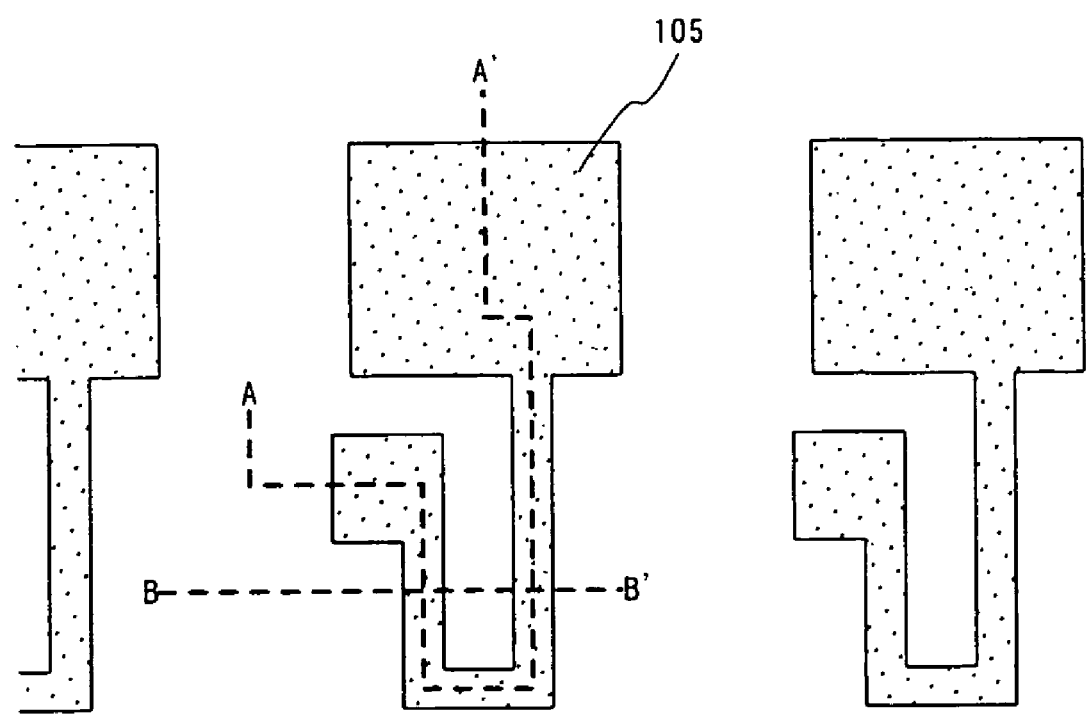

Resist is formed on the crystalline semiconductor film and dry etching is conducted, thus an island shaped semiconductor layer 105 is formed (see FIG. 5).

A gate insulating film 106 having silicon oxide or silicon nitride as its main constituent is formed on the surfaces of the semiconductor layer 105. The gate insulating film 106 may be formed by plasma CVD or sputtering to have a film thickness of 10 to 200 nm, preferably between 50 and 150 nm.

A first conductive film is formed on the gate insulating film 106. The first conductive film is formed from an element selected from the group consisting of Ta, W, Ti, Mo, Al, and Cu, or from an alloy material or a compound material having one of these elements as its main constituent. For example, compounds such as WMo, TaN, MoTa, and $WSi_x$ (where $2.4<x<2.7$) can be used. The first conductive film may be formed to have a thickness of 10 to 100 nm, preferably between 150 and 400 nm.

Note that, although a conductive film made from a single layer film is used in this embodiment, this embodiment is not limited to this structure. A two layer conductive film may also be used for one of the conductive films. In this case, an element selected from the group consisting of Ta, W, Ti, Mo, Al, and Cu, or an alloy material or a compound material having one of these elements as its main constituent, may be formed as the conductive materials forming the two layer conductive film. Specifically, a conductive film in which a tantalum nitride film and a tungsten film are laminated in order can be used. Further, semiconductor films, typically polysilicon films, doped with an impurity element such as phosphorus, and AgPdCu alloys may also be used as a first conductive film and a second conductive film.

Furthermore, the conductive film is not limited to the two-layer structure. For example, a three-layer structure in which a tungsten film, an alloy film of aluminum and silicon (Al—Si), and a titanium nitride film are laminated in order may also be used. In addition, tungsten nitride may also be used as a substitute for tungsten, and an aluminum and titanium (Al—Ti) alloy film may also be used as a substitute for the aluminum and silicon (Al—Si) alloy film, and a titanium film may also be used as a substitute for the titanium nitride film if a three-layer structure is employed.

Note that it is very important to select an optimal etching method and types of etchant in accordance with the conductive film materials.

Figure 6:
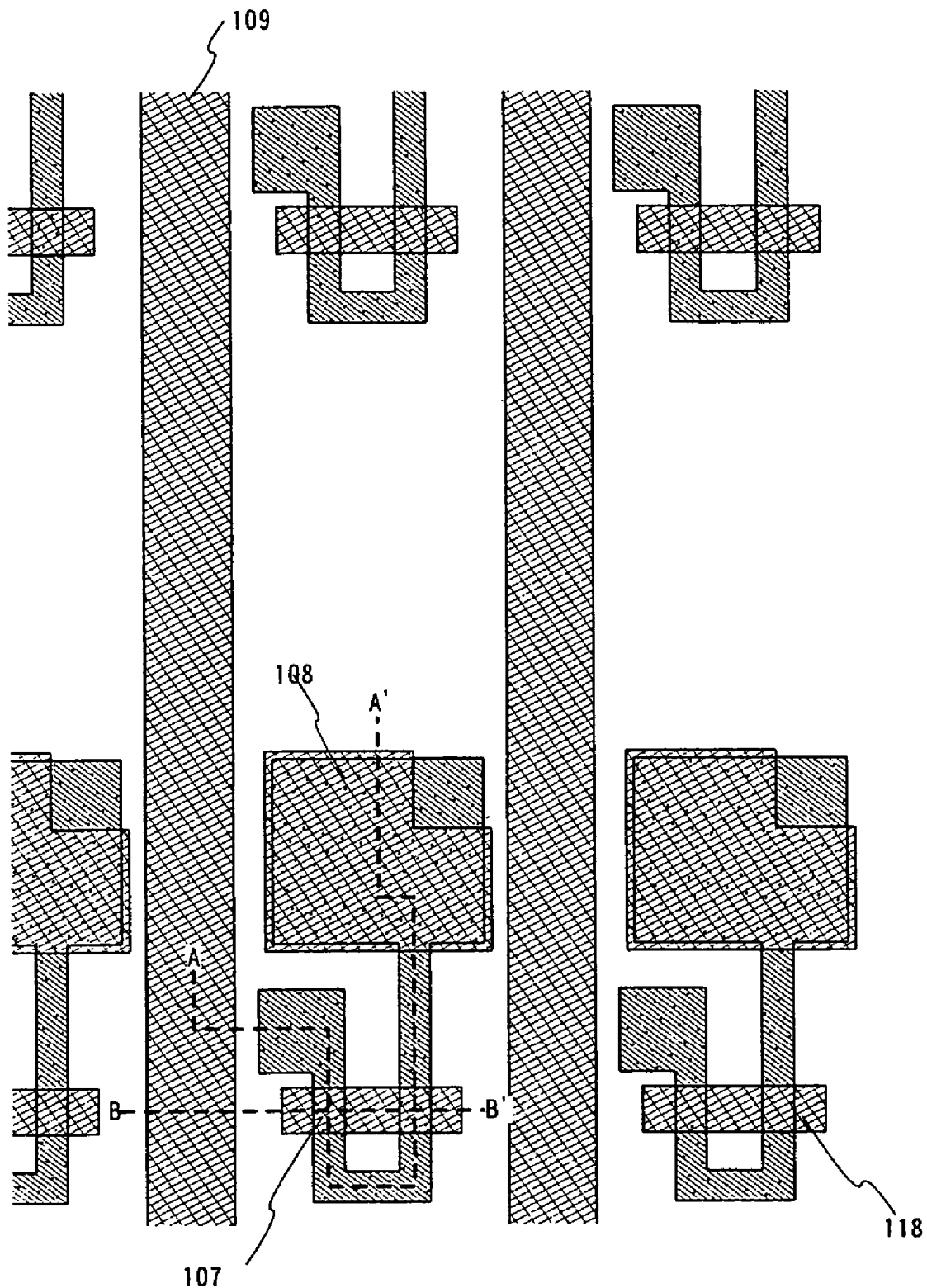
FIG. 6 is a top view for explaining a manufacturing step of the element substrate.

Next, a resist film is formed on the first conductive film, and etching is performed using the resist film as a mask, then, a capacitor electrode 108, a source wiring 109, and a gate line 118 are formed (See FIG. 6). Here, a portion where the gate line 118 and the semiconductor layer 105 are overlapped with each other is a gate electrode 107. Further, when residue is remained after performing etching, it may be conducted ashing. After performing etching, the resist film is peeled using remover.

Next, an n-type impurity region is formed by doping an impurity element imparting n-type to the semiconductor layer 105 using the gate electrode 107 as a mask. In addition, as an impurity element imparting n-type, phosphorous (P), arsenic (As), stibiun (Sb) are well known, however, phosphorus (phosphine: $PH_3$) is doped by ion doping in this embodiment. Thus, phosphorus is doped to the position that is a part of the island like semiconductor layer 105 and not overlapped with the gate electrode. It is preferable that the impurity density is set from $1\times10^{19}$ to $1\times10^{21}$ atoms/$cm^3$, and impurity density of phosphorus is set to $1\times10^{20}$ atoms/$cm^3$ in this embodiment. The impurity density in this specification indicates the number of an impurity atom per volume (/$cm^3$), however, unit of (atoms/$cm^3$) is used in this embodiment as a matter of convenience.

An impurity region formed here serves as a source 102 or a drain 103. Further, a low density impurity region LDD regions) 111 can be formed by reducing partially an amount of added impurities.

A channel region 104 is formed on a part of the semiconductor film that is positioned to be overlapped with the gate electrode 107.

Next, the semiconductor layer 105, the gate electrode 107, and the capacity electrode 108 are covered by resist, and an impurity element imparting p-type is additionally doped, then, a p-type impurity region can be formed on a semiconductor layer of a driver circuit portion.

In addition, as an impurity element imparting p-type, boron (B), aluminum (Al), gallium (Ga) are well-known, in this embodiment, boron (diborane: $B_2H_6$) is doped by ion doping. In this embodiment, boron is doped so as to set the impurity density in a film $2\times10^{20}$ to $2\times10^{21}$ atoms/$cm^3$.

By removing resist, an n-channel TFT can be formed in a pixel portion formed on a substrate, and both an n-channel TFT and p-channel TFT can be formed in a driver circuit, respectively.

Then, an insulating film is formed on the gate electrode 107, a capacitor electrode 108, and a source wiring 109. In this embodiment, the insulating film that has a laminated structure comprising a first insulating film 110 made from an inorganic material and a second insulating film 111 made from an organic material is used. However, the present invention is not limited to the laminated structure of an insulating film, a single layer structure or three or more layers structure can be applied.

Figure 4A:
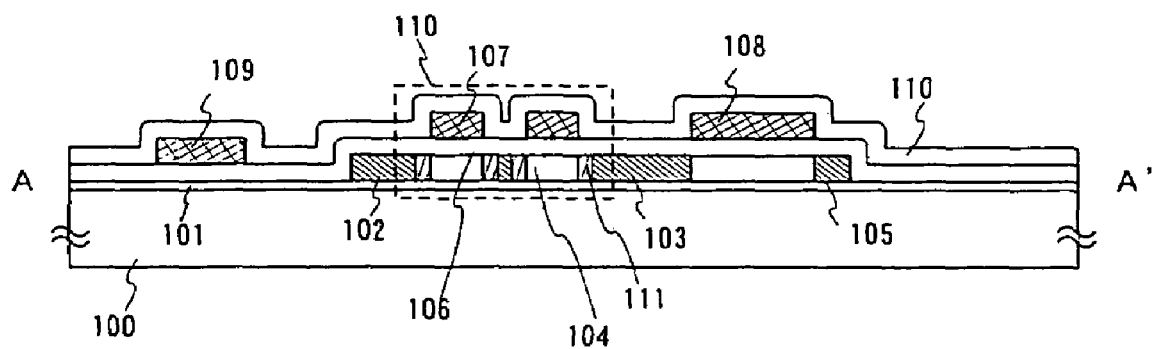
FIGS. 4A to 4C are sectional views for explaining manufacturing steps of the element substrate.

First, the first insulating film 110 made from an inorganic insulating material is formed. In addition, for an inorganic insulating material that is used here, insulating materials containing silicon oxide, silicon nitride, silicon oxynitride, or the like can be used (FIG. 4A).

Further, the second insulating film 111 made from an organic insulating material is formed on the first insulating film 110. In addition, for an organic insulating material that is used here, a photosensitive or a nonphotosensitive organic material (polyimide, acryl, polyamide, resist, benzocyclobutene, or the like) can be used.

In this embodiment, a photosensitive organic insulating material is used for the second insulating film 111. In this case that positive type photosensitive acryl is used for example, it is preferable that only an upper end portion of the second insulating film 111 is curved having a radius of curvature. For a photosensitive organic insulating material, either materials of a negative type that becomes insoluble in etchant depending on light and a positive type that becomes soluble in etchant depending on light can be used.

Next, a contact hole 112 is formed by etching the first insulating film 110, the second insulating film 111, or the gate insulating film. For etching performed here, dry etching or wet etching, which conducted once or in two or more steps can be adopted. In order to form only an upper end portion of the second insulating film 111 to have a radius of curvature, it is preferable to use wet etching. Further, a radius of curvature of the upper end portion is preferable to set finally 0.2 µm to 3 µm. By forming into such a shape, an improvement in quality of deposition of a conductive film formed on the second insulating film 111 can be achieved.

Figure 4B:
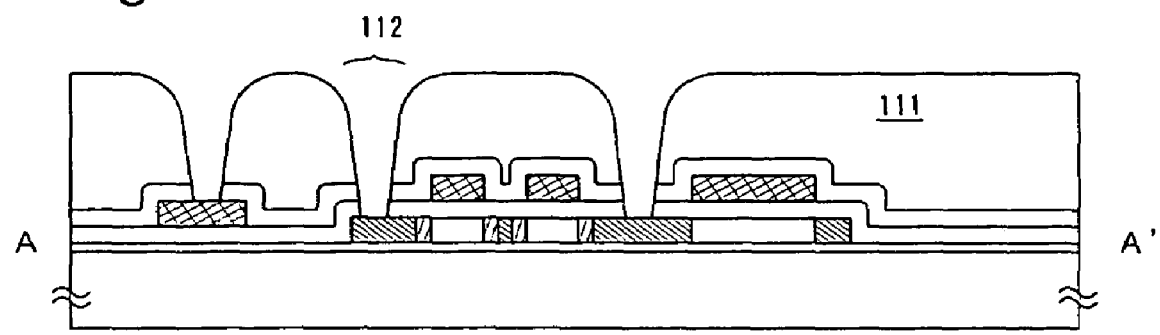
Figure 7:
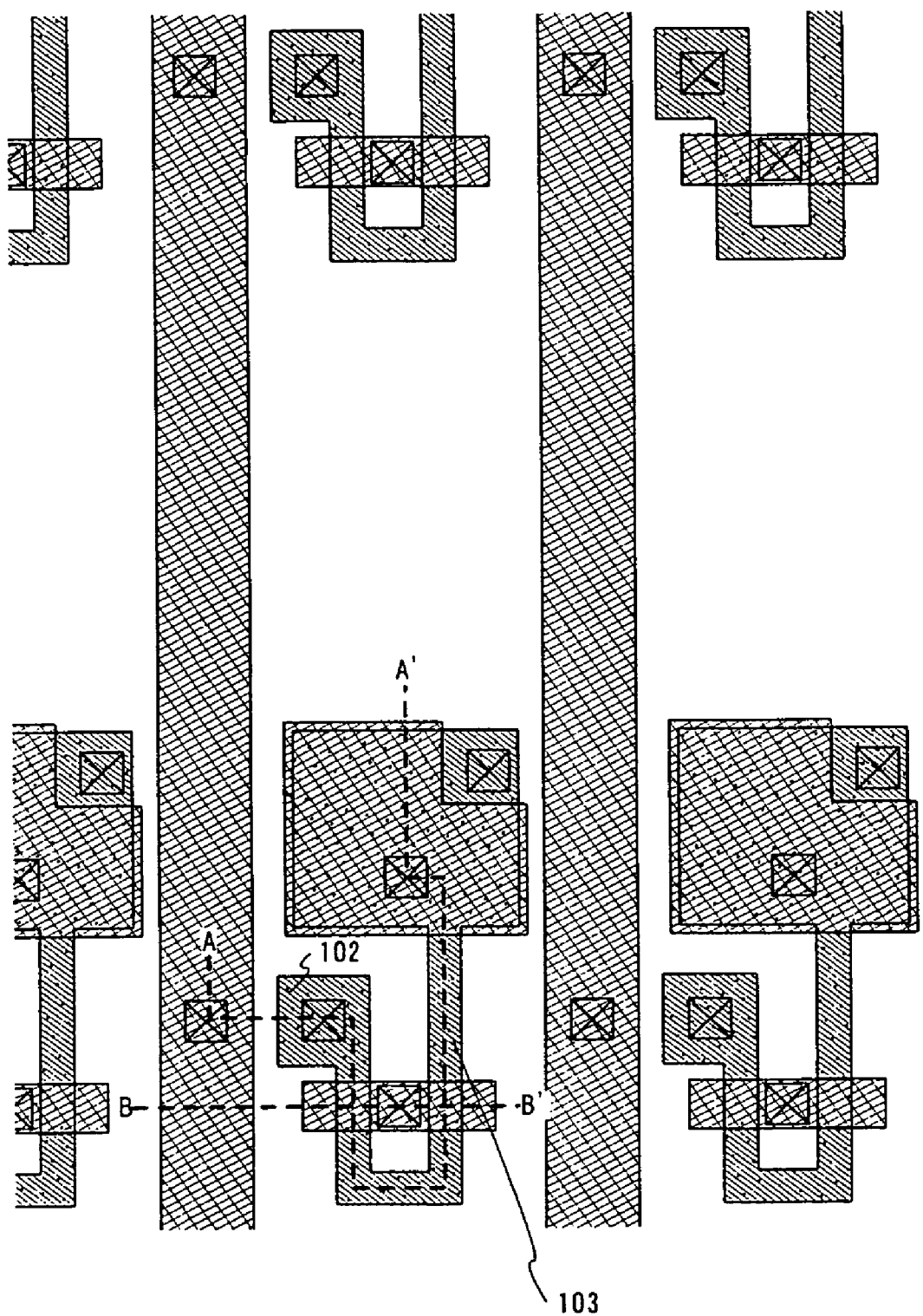
FIG. 7 is a top view for explaining a manufacturing step of the element substrate.

The contact hole 112 is formed to reach the source line 109, the semiconductor layer 105 (the source 102, the drain 103) (FIG. 4B, FIG. 7).

Next, a second conductive film is formed. For forming the second conductive film, a material that is selected in view of forming the first electrode is used. Specifically, indium tin oxide (ITO) known as a transparent conductive film, indium zinc oxide (IZO) made from a mixture of ITO and 2 to 20% zinc oxide, an element such as gold (Au), platinum (Pt), nickel (Ni), tungsten (W), chrome (Cr), Iron (Fe), aluminum (Al), tantalum (Ta), titanium (Ti), or the like, or compounds comprising these elements can be used.

Otherwise, the second conductive film can be formed by laminating these materials in combination. For example, the second conductive film can be also formed in such a manner that a film comprising aluminum (Al), titanium (Ti), titanium nitride (TiN), or the like is deposited to have a thickness that can ensure its translucency (at most 10 nm) and ITO film is deposited thereon. This lamination structure is preferable for reducing wiring resistance and contact resistance.

Figure 4C:
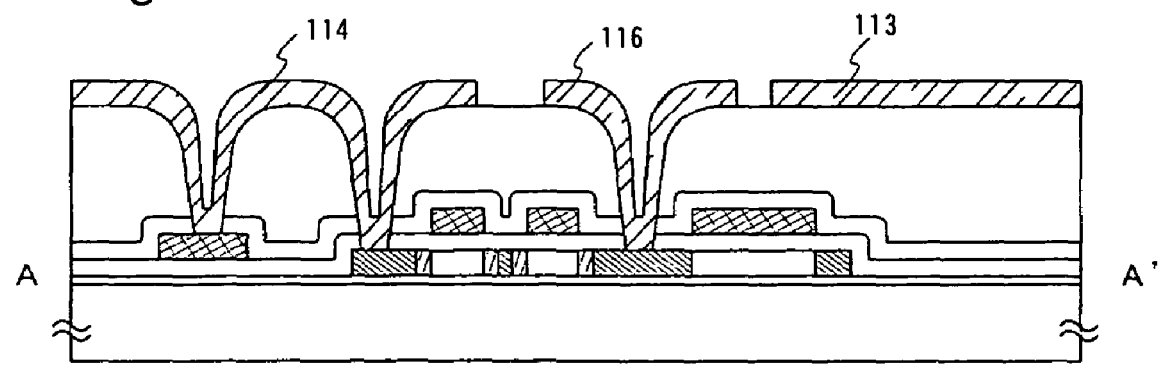

In this embodiment, the second conductive film formed of ITO is formed, and a resist film is formed on the second conductive film, then, etching is conducted using the resist film as a mask by wet etching, and then a first electrode 113, connection wirings 114, 115, and a capacitor wiring 116 are formed (FIG. 4C). Here, the source wiring 109 and the source 102 of TFT 110 are electrically connected with each other by the connection wiring 114, and an island like gate line 118 is electrically connected by the connection wiring 115, and then a capacitor wiring 116 and the capacitor electrode 108 are electrically connected.

When patterning of the second conductive film is conducted to form the first electrode 113, the connection wirings 114, 115, and the capacitor wiring 116, in order to prevent them from short-circuiting, it is important that an optimal shape (line width, or the like), a way of etching, and types of etchant are appropriately selected according to materials for the conductive film.

Thus, the element substrate having the pixel portion structure shown by a top surface view in FIG. 3 is formed.

Embodiment 2

In this embodiment, a manufacturing method of an element substrate having a pixel structure that is described in Embodiment Mode 2 using FIG. 2 is described with reference to FIGS. 9 to 12. In addition, FIG. 9 is a cross-sectional view of the pixel portion structure shown in FIG. 8 taken along the line A-A'. Since symbols used in FIGS. 8 to 12 are common, it can be appropriately referenced each other.

A base film made from silicon nitride film and a base film 601 made from a silicon oxide film are formed on a substrate 600. Besides, same material that is used in Embodiment 1 can be used.

Figure 10:
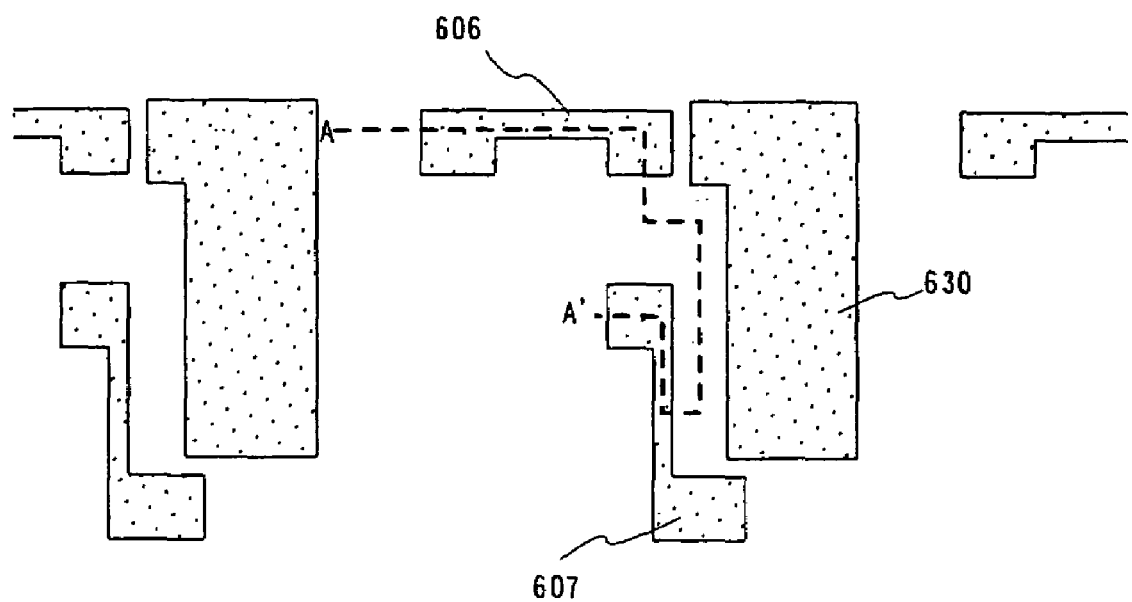
FIG. 10 is a top view for explaining a manufacturing step of the element substrate.
Figure 10:
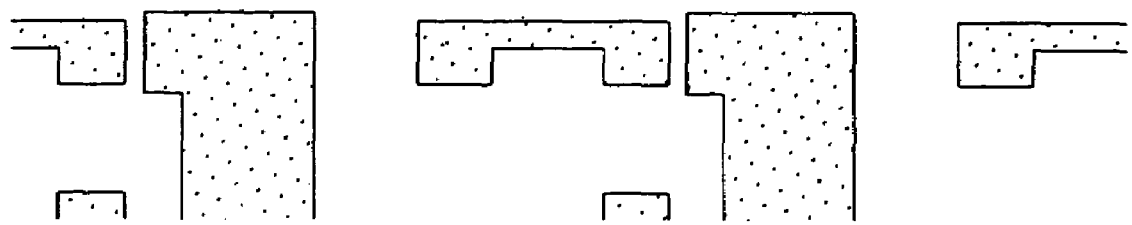

Next, a semiconductor layer (1) 606, a semiconductor layer (2) 607 are formed on the base film 601 (FIG. 10). These semiconductor layers are formed by patterning a crystalline semiconductor film that was crystallized by well-known crystallization an amorphous semiconductor film formed by same method described in Embodiment 1.

Upon forming the semiconductor layer (1) 606, the semiconductor layer (2) 607, and a semiconductor layer (3) 630, a gate insulating film 639 is formed by covering these semiconductor layers. In addition, in this embodiment, the gate insulating film 639 made from silicon oxide is formed, however another well-known insulating materials can be used.

A first conductive film is formed on the gate insulating film 639. The first conductive film is formed from an element selected from the group consisting of Ta, W, Ti, Mo, Al, and Cu, or from an alloy material or a compound material having one of these elements as its main constituent. For example, compounds such as WMo, TaN, MoTa, and WSiX (where 2.4<x<2.7) can be used. The first conductive film may be formed to have a thickness of 10 to 100 nm, preferably between 150 and 400 nm.

In this embodiment a conductive film formed of a single layer is used, however, the present invention is not limited to the structure. In other words, two-layers conductive films can be used as one of the conductive film. Specifically, materials for forming the first conductive film in Embodiment 1 can be used. It is important that the optimal etching method and types of etchant are appropriately selected depending on materials of the conductive film.

Figure 11:
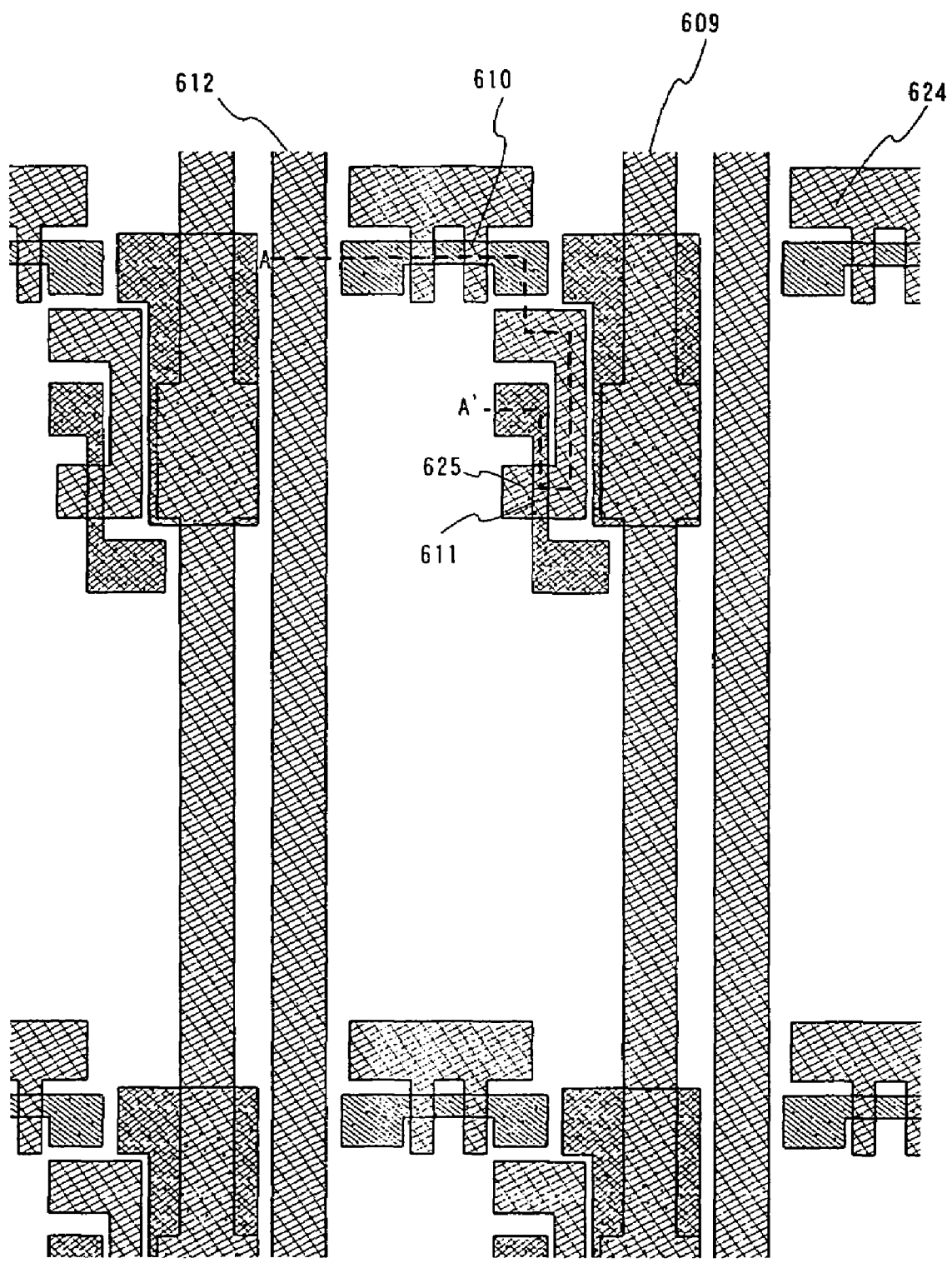
FIG. 11 is a top view for explaining a manufacturing step of the element substrate.

Next, a resist film is formed on the first conductive film, and etching is performed using the resist film as a mask, then, a current supply line 609, a source wiring 612, a gate line (1) 624, and a gate line (2) 625 are formed (FIG. 11). A portion where the gate line (1) 624 is overlapped with the gate line (2) 625 becomes a gate electrode (1) 610, and a portion where the gate line (2) 625 is overlapped with the semiconductor layer (2) 607 becomes a gate electrode (2) 611. Further, when residue is remained after performing etching, it may be conducted ashing. After performing etching, the resist film is peeled using remover.

An n-type impurity region is formed by doping an impurity element imparting an n-type to the semiconductor layer (1) 606 and the semiconductor layer (2) 607 by using the gate electrode (1) 610 and the gate electrode (2) 611 that are formed here (FIG. 11). In addition, as an impurity element imparting n-type, phosphorous (P), arsenic (As), stibium (Sb) are well known, however, phosphorus (phosphine: $PH_3$) is doped by ion doping in this embodiment. Thus, phosphorus is doped to the position that is a part of the semiconductor layer (1) 606 and not overlapped with the gate electrode. It is preferable that the impurity density is set from $1\times10^{19}$ to $1\times10^{21}$ atoms/cm$^3$, and impurity density of phosphorus is set to $1\times10^{20}$ atoms/cm$^3$ in this embodiment.

An impurity region formed here serves as a source or a drain (the source 602, the drain 603). Further, a low density impurity region (LDD regions) 605 can be formed by reducing partially an amount of added impurities.

A channel region is formed in a part of the semiconductor film that positioned to be overlapped with the gate electrode. For example, a channel region 604 is formed at the position that is a part of the semiconductor and not overlapped with the gate electrode (1) 610.

Next, the semiconductor layer (1) 606 and the gate electrode (1) 610 are covered by resist, and an impurity element imparting p-type is additionally doped, then, a p-type impurity region can be formed on a part of the semiconductor layer (2) that is not overlapped with the gate electrode (2) 611.

In addition, as an impurity element imparting p-type, boron (B), aluminum (Al), gallium (Ga) are well known, however, boron (diborane: $B_2H_6$) is doped by ion doping in this embodiment. In this embodiment, boron is doped so as to set the impurity density in a film $2\times10^{20}$ to $2\times10^{21}$ atoms/cm$^3$.

An impurity region formed here serves as a source or a drain (source 613, a drain 608). Further, a low density impurity region (LDD regions) can be formed by reducing partially an amount of added impurities. A channel region is formed in a part of the semiconductor layer (2) 607 that positioned to be overlapped with the gate electrode (2) 611.

By removing resist, a switching TFT formed of an n-channel TFT and a current control TFT formed of a p-channel TFT can be formed in a pixel portion that is formed on a substrate, and both of an n-channel TFT and a p-channel TFT can be formed in a driver circuit portion, respectively. In addition, with respect to TFT for forming the switching TFT and a current control TFT, it is not necessary to form in above combination; TFT of n-channel or p-channel can be appropriately used in a most suitable combination thereof.

Next, an insulating film is formed on the gate electrode (1) 610, the gate electrode (2) 611, and a source wiring 612. In this embodiment, a lamination film comprising a first insulating film 615 made from an inorganic insulating material and a second insulating film 616 made from an organic insulating material can be used for the insulating film. However, the present invention is not limited to a lamination structure of the insulating film, a single-layer structure or a three or more layers-structure can be used.

Figure 9A:
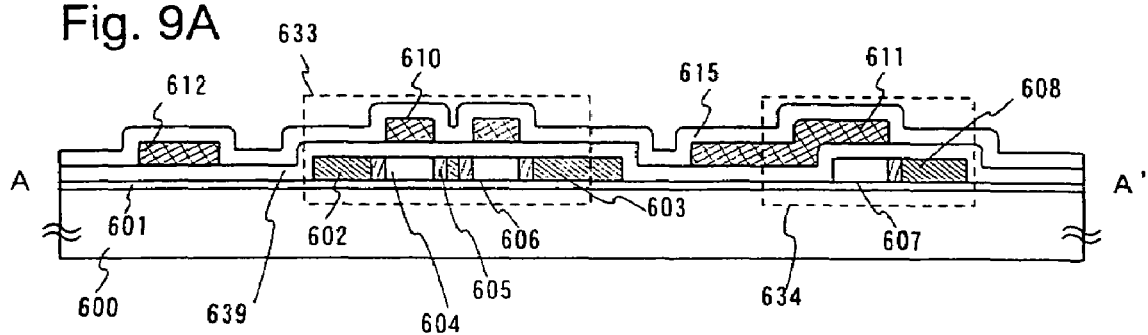
FIGS. 9A to 9D are sectional views for explaining manufacturing steps of the element substrate.

First, the first insulating film 615 made from inorganic insulating material is formed. For an inorganic insulating material that is used here, an insulating material containing silicon such as silicon oxide, silicon nitride, or silicon oxynitride can be used (FIG. 9A).

Further, the second insulating film 616 made from organic insulating materials is formed on the first insulating film 615. For an organic insulating material that is used here, a photosensitive or a nonphotosensitive organic material (polyimide, acryl, polyamide, polyimideamide, resist, benzocyclobutene, or the like) can be used.

In this embodiment, a photosensitive organic insulating material is used for the second insulating film 616. In this case, when positive type organic acryl is used, for example, it is preferable that only an upper end portion of the second insulating film is curved to have a radius of curvature. In addition, for photosensitive organic insulating material, either materials of a negative type that becomes insoluble in etchant depending on light and a positive type that becomes soluble in etchant depending on light can be used.

Next, a contact hole 617 is formed by etching the first insulating film 615, a second insulating film 616, or the gate insulating film. For etching performed here can adopt dry etching or wet etching, which conducted once or in two or more steps. In order to form only an upper end portion of the second insulating film 616 to have a radius of curvature, it is preferable to use wet etching. Further, a radius of curvature of the upper end portion is preferable to set finally 0.2 μm to 3 μm. By forming into such a shape, an improvement in quality of deposition of a conductive film formed on the second insulating film 616 can be achieved.

Figure 9B:
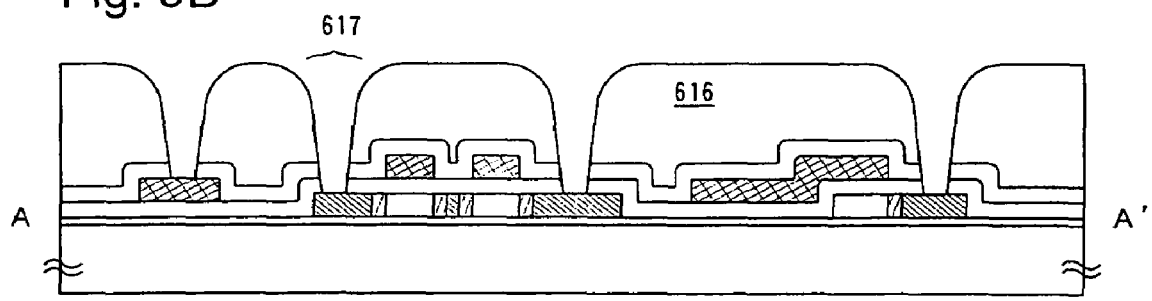
Figure 12:
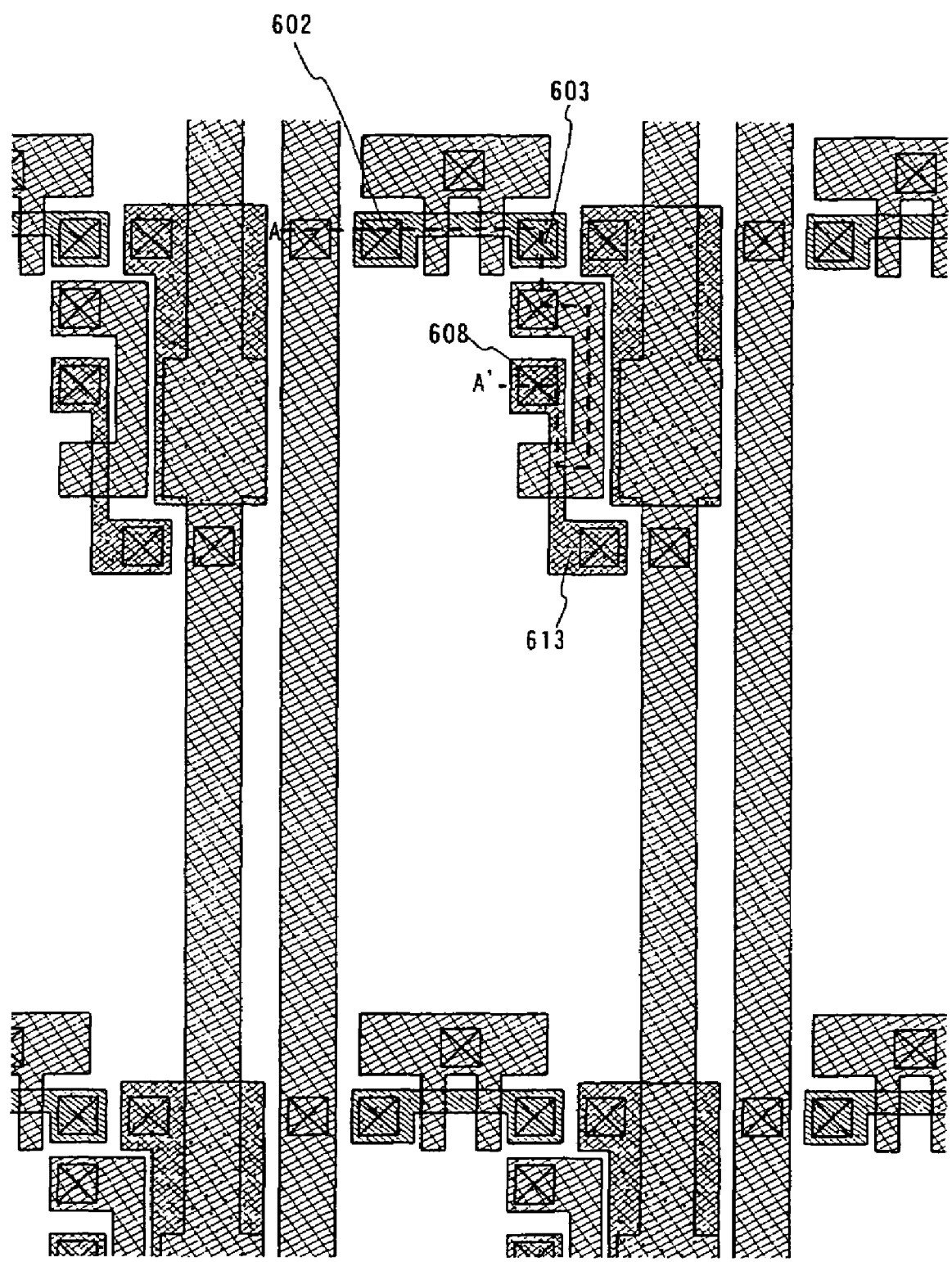
FIG. 12 is a top view for explaining a manufacturing step of the element substrate.

The contact hole 617 is formed to reach the source line 612, the semiconductor layer (1) 606 (the source 602, the drain 603), the semiconductor layer (2) 607 (source 613, drain 608) (FIG. 9B, FIG. 12).

Next, a second conductive film is formed. For forming the second conductive film, a material that is selected in view of forming the first electrode is used. Specifically, indium tin oxide (ITO) known as a transparent conductive film, indium zinc oxide (IZO) made from a mixture of ITO and 2 to 20% zinc oxide, an element such as gold (Au), platinum (Pt), nickel (Ni), tungsten (W), chrome (Cr), Iron (Fe), aluminum (Al), tantalum (Ta), titanium (Ti), or the like, or compounds comprising these elements can be used.

Otherwise, the second conductive film can be formed by laminating these materials in combination. For example, the second conductive film can be also formed in such a manner that a film comprising aluminum (Al), titanium (Ti), titanium nitride (TiN), or the like is deposited to have a thickness that can ensure its translucency (at most 10 nm), and ITO film is deposited thereon. This lamination structure is preferable for reducing wiring resistance and contact resistance.

Figure 9C:
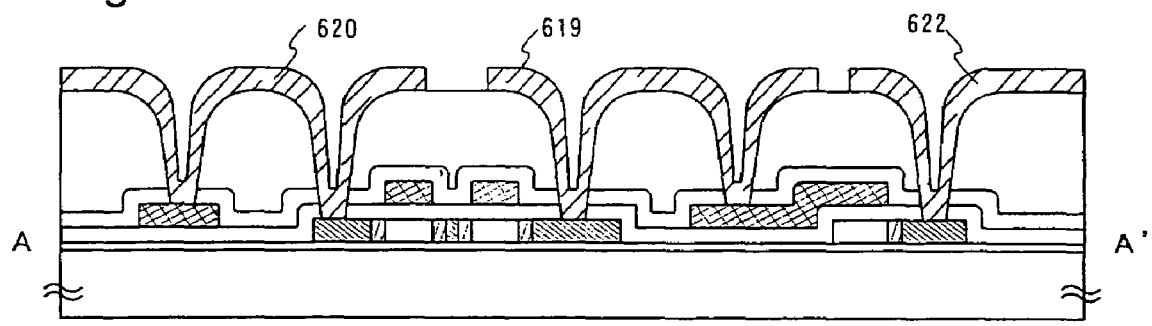

In this embodiment, the second conductive film formed of ITO is formed, and a resist film is formed on the second conductive film, then, etching is conducted using the resist film as a mask, and then a first electrode 622, connection wirings 614, 618, 619, and 620 are formed (FIGS. 8, 9C). Here, the source 613 of a current control TFT 634 and a current supply line 609 are electrically connected with each other by the connection wiring 614, and an island like gate line (1) 624 is electrically connected by the connection wiring 618, then, the drain 603 of the switching TFT 633, the gate electrode (2) 611 of the current control TFT 634, and the semiconductor layer (3) 630 are connected electrically by the connection wiring 619, and then, the source wiring 612 and the source 602 of the switching TFT 633 are electrically connected by the connection wiring 620.

When patterning of the second conductive film is conducted to form the first electrode 622, the connection wirings 614, 618, 619, and 620, in order to prevent them from short-circuiting, it is important that an optimal shape (line width, or the like), a way of etching, and types of etchant are appropriately selected according to materials for the conductive film.

Thus, the element substrate having the pixel portion shown by a top surface view in FIG. 8 is formed.

Figure 9D:
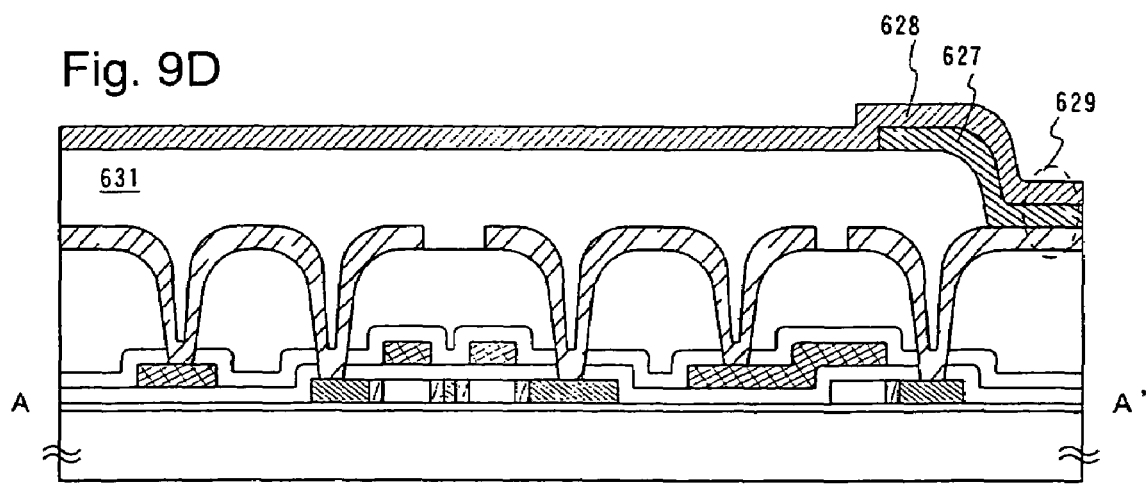

In the case that a light emitting element is formed on the element substrate shown in FIG. 8 in this embodiment, the element substrate has the structure that is shown in FIG. 9D.

Thus, a light emitting element 629 is completed by forming an organic compound layer 627 made from organic compounds on the first electrode 622 that included in the element substrate, and by forming a second electrode 628 on the organic compound layer 627. It is preferable that an end portion of the first electrode 622 is covered by an insulating film 631 as shown in FIG. 9D for preventing the organic compounds of the organic compound layer 627 from being deteriorated due to electric concentration at the end portion of the first electrode 622. The insulating film 631 is formed using a photosensitive organic insulating material as same as the second insulating film 616 that was previously formed, and a radius of curvature of the upper end portion of the insulating film 631 is preferably set to 0.2 μm to 3 μm by removing a portion that overlaps with the first electrode. By forming into such a shape, an improvement in quality of deposition of the organic compound layer 627 that will be formed next can be achieved.

For forming the organic compound layer 627, either a low molecular organic compound material or a high molecular organic compound material can be used. In addition, the organic compound material contains not only known organic compound materials but also organic compound materials that include partially inorganic compounds.

The organic compound layer 627 is deposited by laminating a hole transporting material, a luminescent material, an electron transporting material, a blocking material, and a functional material such as a hole injection material. In the present invention, a laminated structure of an organic compound layer is liberty to combine any materials. Preferable materials will be described below. However, a material used in the present invention is not limited to these materials. Further, it is not limited to above-mentioned functional materials, another known functional materials can be used.

Aromatic amine-based compounds (namely, those having benzene ring-nitrogen bonds) are suitable for the hole transporting material. Materials widely used include: starburst type aromatic amine compounds such as 4,4'-bis [N-(1-naphthyl)-N-phenyl-amino]-biphenyl which is the derivative (hereinafter, referred to as α-NPD); 4,4',4''-tris(N,N-diphenyl-amino)-triphenylamine (hereinafter, referred to as TDATA); and 4,4',4''-tris [N-(3-methylphenyl)-N-phenyl-amino]-triphenylamine (hereinafter, referred to as MTDATA) in addition to the above-mentioned TPD thereof.

Specifically, effective as the light emitting material are various fluorescent pigments as well as metal complexes such as tris(8-quinolinolato)aluminum (hereinafter, referred to as $Alq_3$), tris(4-methyl-8-quinolinolato)aluminum (hereinafter, referred to as $Almq_3$), bis (10-hydroxybenzo[h]-quinolinato) beryllium (hereinafter, referred to as $BeBq_2$), bis (2-methyl-8-quinolinolate)-(4-hydroxy-biphenylyl)aluminum (hereinafter, referred to as BAlq), bis[2-(2-hydroxyphenyl)-benzoxazolato]zinc (hereinafter, referred to as $Zn(BOX)_2$), and bis [2-(2-hydroxyphenyl)-benzothiazolato]zinc (hereinafter, referred to as $Zn(BTZ)_2$). In addition, triplet light emission materials may also be used, and metal complexes each containing platinum or iridium as a central metal can also be used. The triplet light emission materials include: tris(2-phenylpyridine)iridium (hereinafter, referred to as $Ir(ppy)_3$); 2,3,7,8,12,13,17,18-octaethyl-21H, 23H-porphyrin-platinum (hereinafter, referred to as PtOEP); and the like.

Metal complexes having quinoline skeleton or benzoquinoline skeleton such as the above-mentioned $Alq_3$, $Almq_3$, and $BeBq_2$, BAlq serving as a mixed ligand complex, and the like are suitable for electron transporting materials. Metal complexes having oxazole-based ligands or thiazole-based ligands such as $Zn(BOX)_2$ and $Zn(BTZ)_2$ are also suitable. Furthermore, other than metal complexes, oxadiazole derivatives such as 2-(4-biphenylyl)-5-(4-tert-buthylphenyl)-1,3,4-oxadiazole (hereinafter, referred to as PBD) and 1,3-bis [5-(p-tert-butylphenyl)-1,3,4-oxadiazole-2-yl]benzene (hereinafter, referred to as OXD-7), triazole derivatives such as 3-(4-tert-butylphenyl)-4-phenyl-5-(4-biphenylyl)-1,2,4-triazole (hereinafter, referred to as TAZ) and 3-(4-tert-butylphenyl)-4-(4-ethylphenyl)-5-(4-biphenylyl)-1,2,4-triazole (hereinafter, referred to as p-EtTAZ), and phenanthroline derivatives such as bathophenanthroline (hereinafter, referred to as Bphen) and bathocuproine (hereinafter, referred to as BCP) can be used therefor.

Furthermore, within the framework of organic compounds, porphyrin-based compounds are effective for the hole injection material, so that a phthalocyanine (hereinafter, referred to as $H_2$-Pc), a copper phthalocyanine (hereinafter, referred to as CuPc), or the like can be used therefor. In addition, materials obtained by performing chemical doping on conductive polymeric compounds are also effective therefor, so that polyethylene dioxythiophene (hereinafter, referred to as PEDOT) doped with polystyrene sulfonate (hereinafter, referred to as PSS), polyaniline, polyvinylcarbazole (hereinafter, referred to as PVK), or the like can be used therefor.

Furthermore, the above-mentioned BAlq, OXD-7, TAZ, p-EtTAZ, Bphen, BCP, or the like can be used for the blocking material.

In this embodiment, the first electrode 622 is formed by ITO and an anodic material having a work function which is equal to or less than 4.5 eV, so that the first electrode 622 functions as an anode of a light emitting element 629. Therefore, the second electrode 628 that is formed by sandwiching the organic compound layer 627 with the first electrode 622 is formed using the cathodic material serving as a cathode having a work function which is equal to or less than 3.8 eV. Specifically, elements residing in group 1 or group 2 of the element periodic law, that is, alkaline metals such as Li and Cs, and alkaline earth metals such as Mg, Ca and Sr, alloys (Mg:Ag, Al:Li) and chemical compounds (LiF, CsF, $CaF_2$) that contain these elements, and in addition, transition metals containing rare earth metals can be used. A laminate with a metal such as Al, Ag, or ITO (including alloys) may also be formed.

Specifically, in addition to ITO, indium zinc oxide (IZO) that is made from a mixture of indium oxide that a transparent material and 2 to 20% zinc oxide, an element such as gold (Au), platinum (Pt), nickel (Ni), tungsten (W), chrome (Cr), molybdenum (Mo), Iron (Fe), cobalt (Co), copper (Cu), palladium (Pd), nitride metal materials (TiN), or the like can be used for the anodic materials having a work function which is equal to or less than 4.5 eV.

Furthermore, since the first electrode 622 is formed using ITO having translucency (specifically, the transmittance of visible light is no fewer than 40%), the second electrode is formed using the conductive film having a light blocking effect (specifically, the transmittance of visible light is less than 10%) that is formed by laminating $CaF_2$ and Al. Here, $CaF_2$ is formed to have a thickness of 2 nm, and Al is formed to have a thickness of 200 nm. If sufficient light blocking effect can not be achieved, the thickness of Al can be made thick. Therefore, light generated in the organic compound layer 627 is emitted from the first electrode toward the element substrate side (a bottom emission).

However, the present invention is not limited to this structure, the structure that light generated in the organic compound layer 627 is emitted toward an opposite side of the element substrate by forming the first electrode 622 using light shielding anodic materials and the second electrode 628 using translucent cathodic materials (a top emission), or the structure that light generated in the organic compound layer 627 is emitted toward the element substrate by forming the first electrode 622 using translucent cathodic materials, and the second electrode 628 using light shielding anodic materials (a bottom emission) can be formed.

Depending on a material selection for above-mentioned first electrode 622, the connection wiring 614, 618, 619 and 620 are formed by same materials as that for the first electrode. Thus, the same material can be used for the second conductive film that forms the first electrode 622, and connection wirings 614, 618, 619, 620. For forming the second conductive film, not only materials for forming the first electrode (anodic materials having work function no less than 4.5 eV, or cathodic materials having work function fewer than 3.8 eV), but also materials having high conductivity are preferable to be selected.

Embodiment 3

Figure 13:
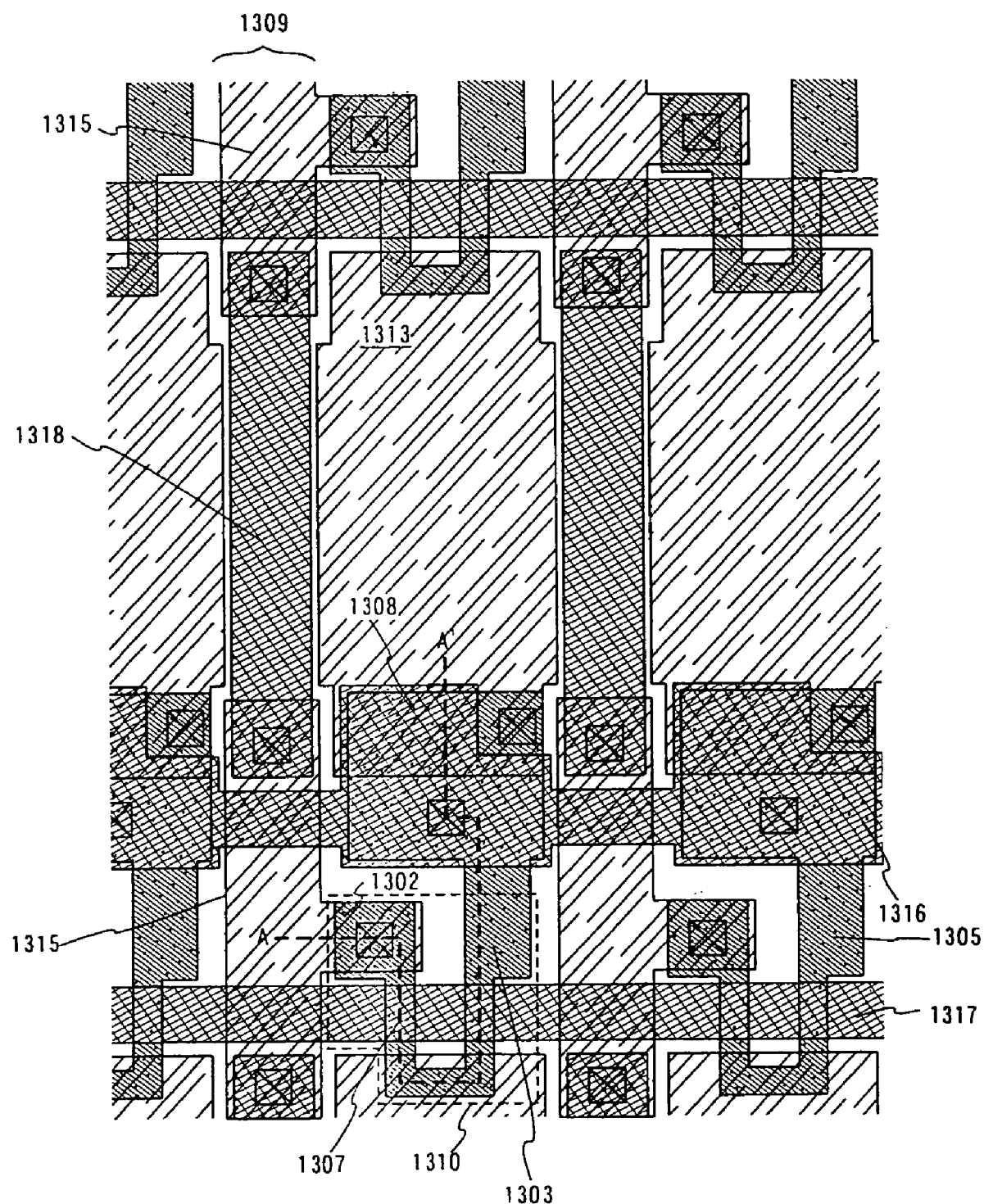
FIG. 13 is a view for explaining an element substrate that is manufactured according to the present invention.

In this embodiment, the structure of an element substrate that is finally formed with a liquid crystal display device that is same as the element substrate described in Embodiment 1 but different from that with respect to the structure described in Embodiment 1 is described. In FIG. 13, a structure of a pixel portion of an element substrate is especially described.

As shown in FIG. 13, the element substrate comprises a gate wiring 1317 positioned in a line direction, a capacitor wiring 1316, a source wiring 1309 positioned in a row direction, a pixel portion having TFT 1310 formed in a neighborhood where a gate wiring and a source wiring intersect each other, and a driver circuit (not shown) having an n-channel TFT and a p-channel TFT.

The source wiring 1309 in FIG. 13 is electrically connected with an island like source line 1318 that is positioned in a row direction by a connection wiring 1315. The island like source line 1318 is formed in contact with a surface of the gate insulating film as same as the gate wiring 1317 (including the gate electrode 1307) and the capacitor wiring 1316. In addition, the connection wiring 1315 is formed on the first and the second insulating film (interlayer insulating film) as same as the first electrode 1313. The connection wiring 1315 connects electrically the island like source line 1318, as well as connects electrically the source wiring 1309 and the source 1302 of the TFT 1310 each other. The first electrode 1313 is electrically connected to the drain 1303 of the TFT 1310.

By forming such structure, both of the first electrode 1313 and the connection wiring 1315 can be simultaneously formed on the same film deposition surface.

A storage capacitor of the first electrode 1313 is formed of the semiconductor layer 1305 that is connected to the first electrode 1313 and the capacitor wiring 1316 using an insulating film (gate insulating film) covering the semiconductor layer 1305 as dielectric.

In this embodiment, the number of mask is 5 that is required for forming an element substrate that has a pixel portion having a pixel structure shown in FIG. 13 and a driver circuit. That is, the first mask is for patterning the semiconductor layer 1305, the second mask is for patterning the gate wiring 1317, the capacitor wiring 13-16, and the island like source line 1308, the third mask is for covering the n-channel TFT when impurity elements imparting p-type is doped in order to form the p-channel TFT of the driver circuit, the fourth mask is for forming contact holes that reach each the semiconductor layer 1305, the island like source line 1308, the gate wiring 1317, and the fifth mask is for patterning the first electrode 1313, and the connection wiring 1315.

As mentioned above, the element substrate can be formed using small number of masks also in cases where the pixel structure shown in FIG. 13 is formed.

Embodiment 4

Figure 14:
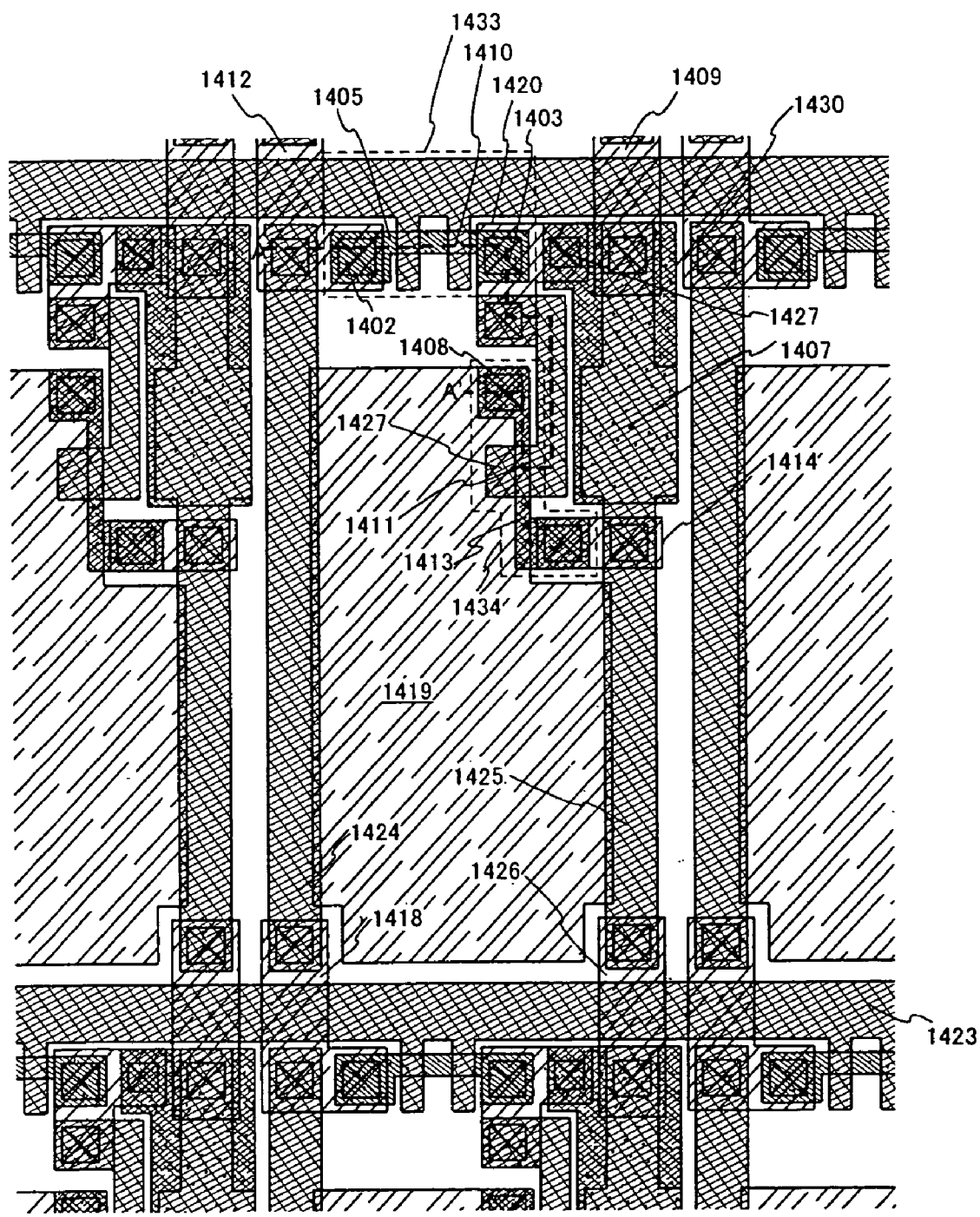
FIG. 14 is a view for explaining an element substrate that is manufactured according to the present invention.

In this embodiment, the structure of an element substrate that is formed with a light emitting device that is same as the element substrate described in Embodiment 2 but different from that with respect to the structure described in Embodiment 2 is described. In FIG. 14, a structure of a pixel portion of an element substrate is especially described.

As shown in FIG. 14, the element substrate comprises a gate wiring 1423 positioned in a line direction, a source wiring 1412 positioned in a row direction, a pixel portion having TFT (a switching TFT 1433 and a current control TFT 1434) formed in a neighborhood where a gate wiring and a source wiring and a driver circuit (not shown) having an n-channel TFT and a p-channel TFT intersect each other.

The source wiring 1412 in FIG. 14 indicates the one that is electrically connected with an island like source line 1424 positioned in a row direction by a connection wiring 1418. In addition, a current supply line 1409 indicates the one that is electrically connected with an island like power source line 1425 positioned in a row direction by a connection wiring 1426. The island like source line 1424 and a power source line 1425 are formed in contact with a surface of the insulating film as same as a gate wiring 1423 and a gate line 1427 (including the gate electrode (2) 1411). In addition, the connection wiring 1414, 1418, 1420, 1426 are formed on the first and the second insulating films (interlayer insulating film) as same as the first electrode 1419. The connection wiring 1414 connects electrically a drain of the current control TFT 1434 and a current supply line 1409 each other. The connection wiring 1420 connects electrically a drain 1403 of the switching TFT 1433, the gate electrode (2) 1411 of the current control TFT 1434, and the semiconductor layer (3) 1430. The connection wiring 1418 can connect electrically the source wiring 1412 and a source 1402 of the switching TFT 1433.

By forming such structure, both of the connection wirings (1414, 1418, 1420, 1426, 1427) and the first electrode 1419 can be simultaneously formed on the same film deposition surface.

A storage capacitor of the first electrode 1419 is formed of the semiconductor layer (3) 1430 that is connected to the drain 1403 of the switching TFT 1433 and the capacitor 1407 formed of a part of the current supply line 1409 using an insulating film (gate insulating film) covering the semiconductor layer (3) 1430 as dielectric.

The number of mask is 5 that are required for forming a pixel portion having a pixel structure shown in FIG. 14 and an element substrate having a driver circuit. That is, the first mask is for patterning the semiconductor layer (1) 1405, the semiconductor layer (2) 1413, the semiconductor layer (3) 1430, the second mask is for patterning the gate wiring 1423, the island like source line 1424, the island like power source line 1425, and the island like gate line (2) 1427, the third mask is for covering the n-channel TFT when impurity elements imparting p-type is doped in order to form the p-channel TFT of the driver circuit, the fourth mask is for forming contact holes that reach each the semiconductor layer (1) 1405, the semiconductor layer (2) 1413, the island like source line 1424, the island like power source line 1425, the island like gate line (2) 1427, and the gate wiring 1423, and the fifth mask is for patterning the connection wirings (1414, 1418, 1420, 1426) and the first electrode 1429.

As mentioned above, the element substrate can be formed using small number of masks in cases where the pixel structure shown in FIG. 14 is formed.

Embodiment 5

Figure 15:
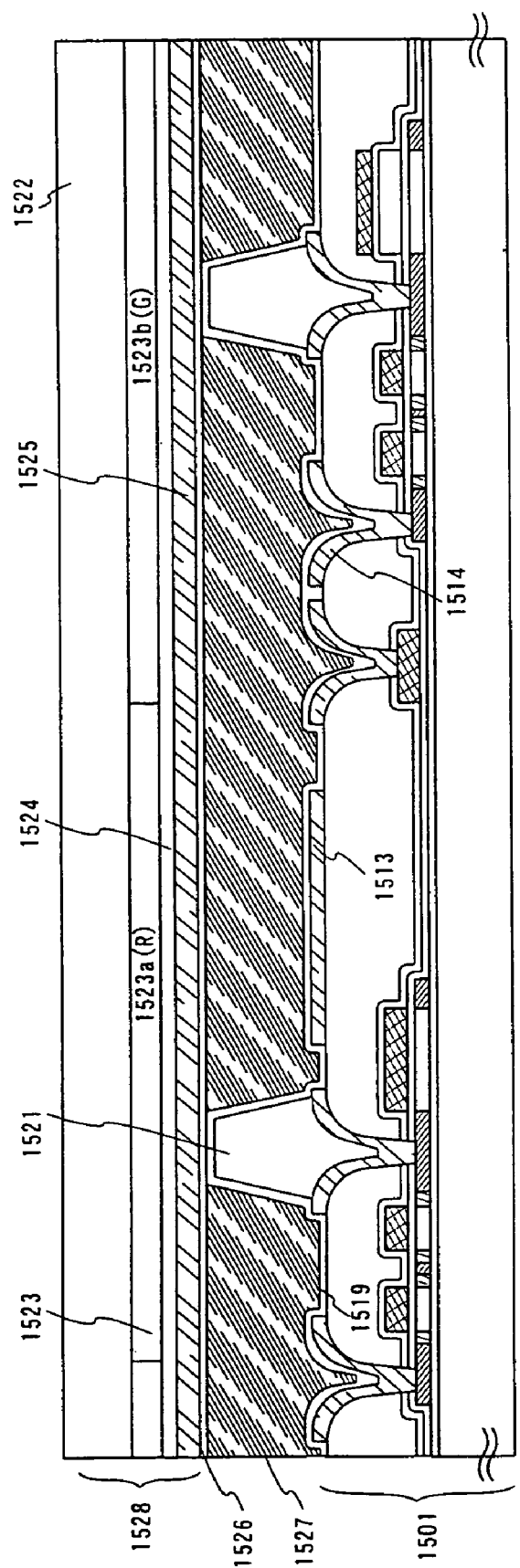
FIG. 15 is a view for explaining a liquid crystal display device that is manufactured according to the present invention.

This embodiment describes a structure of a liquid crystal display device formed using an element substrate having a pixel portion structure shown in Embodiment 1 with reference to FIG. 15.

An orientation film 1519 is formed on the element substrate and subjected to a rubbing process as shown in FIG. 15. Columnar spacers 1521 made from an organic resin are provided in a desired position to keep the substrates with spacing. Meanwhile, formation sequences of the spacers 1521 and the orientation film 1519 may be inverted.

Then, a counter substrate 1528 has coloring layers 1523 (1523a, 1523b), a planarizing film 1524, and a counter electrode 1525 formed of a transparent conductive film on a substrate 1522. For the coloring layers 1523, red coloring layer 1523a, blue coloring layer 1523b, and a green coloring layer (not shown) are formed. A shielding portion may be formed by partly overlapping these coloring layers together. The counter electrode 1525 is formed on the planarizing film 1524 that becomes a pixel portion. An orientation film 1526 is formed on the counter electrode 1525.

Then, the element substrate 1501 and the counter substrate 1528 are bonded with each other using a sealant (not shown). The sealant has fillers mixed therein, and the two substrates are bonded with a uniform interval (preferably, 0.2 μm to 3.0 μm) by the filler and the spacer. Thereafter, a liquid crystal material is injected between the substrates and an end-sealing material (not shown) is used to completely seal the substrates. A known liquid crystal material 1527 can be used.

In the case of using the structure shown in FIG. 15, incident light upon a surface of the counter substrate 1528 side is modulated by the liquid crystal material 1527 and emerged from the element substrate 1501 side.

In the present invention, the first electrode may be formed of a metal film having reflexivity (specifically, an aluminum (alloy) film, or the like). In this case, incident light upon a surface of the counter substrate 1528 side is modulated by the liquid crystal material 1527, and emerged from the counter substrate 1528 side. In the case of using this structure, since light is not transmitted though a bottom of the first electrode, a memory element, a resistive element, or the like can be provided.

The structure of the liquid crystal display device described in this embodiment can be implemented in cases where the element substrate described in Embodiment 3 is used.

Embodiment 6

A structure of the light emitting device that is formed using an element substrate having a pixel portion structure shown in Embodiments 2 and 4 is described in this embodiment with reference to FIG. 16.

Figure 16A:
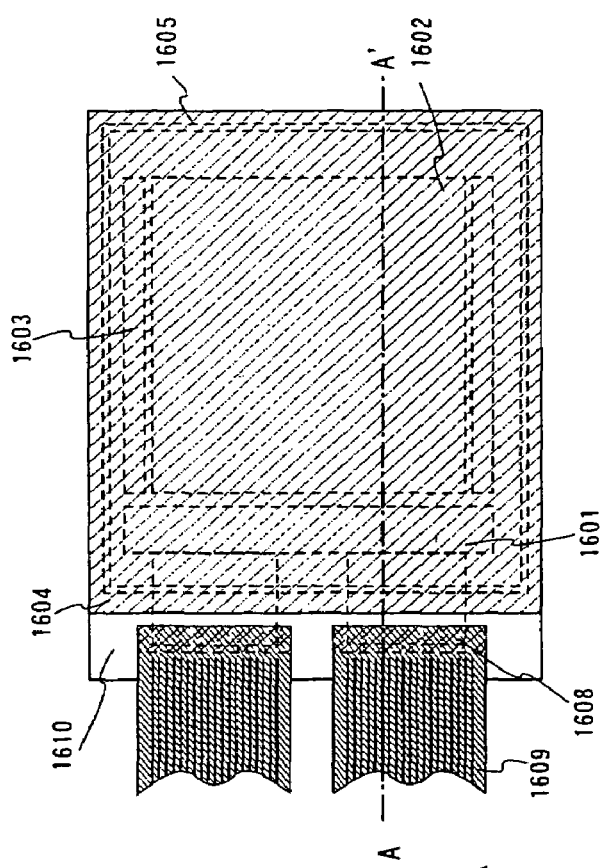
FIGS. 16A and 16B are views for explaining a light emitting device that is manufactured according to the present invention.
Figure 16B:
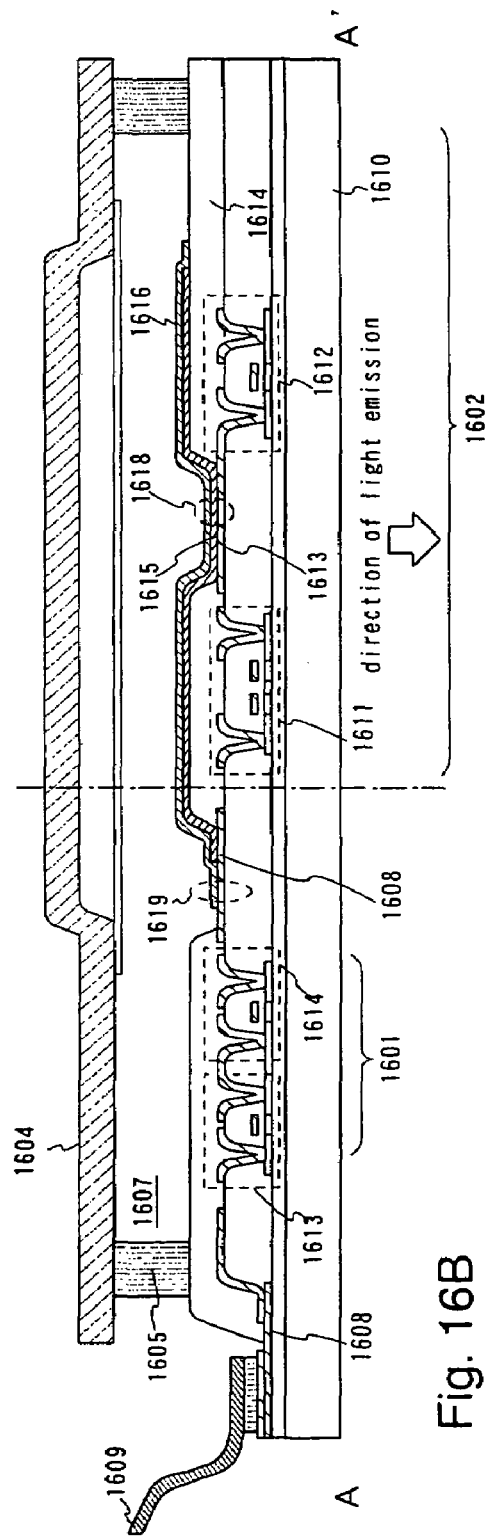

FIG. 16A is a top view of the light emitting device, and FIG. 16B is a sectional view taken on line A-A' of FIG. 16A. Reference number 1601 represents a source side driver circuit, which is shown by a dotted line; 1602, a pixel portion; 1603, a gate side driver circuit; 1604, an encapsulating can; and 1605, a sealant. Inside surrounded by the sealant 1605 is an empty space 1607.

Reference number 1608 represents wiring for transmitting signals inputted to the source side driver circuit 1601 and the gate side driver circuit 1603. The wiring 1608 receives video signals or clock signals from a flexible print circuit (FPC) 1609, which will be an external input terminal. Only the FPC is illustrated, but it is electrically connected to an external power.

The following will describe a sectional structure, referring to FIG. 16B. The driver circuits and the pixel portion are formed on the substrate 1610, but the source side driver circuit 1601 as one of the driver circuits and the pixel portion 1602 are shown in FIG. 16B.

In the source signal line driver circuit 1601, a CMOS circuit wherein an n-channel type TFT 1613 and a p-channel type TFT 1614 are combined is formed. The TFTs constituting the driver circuit may be composed of known CMOS circuits, PMOS circuits or NMOS circuits. In this embodiment, a driver-integrated type, wherein the driver circuit is formed on the substrate, is illustrated, but the driver-integrated type may not necessarily be adopted. The driver may be fitted not on the substrate but to the outside.

The pixel portion 1602 is composed of plural pixels including a switching TFT 1611 that is inputted video signals from the source side driver circuit, a current control TFT 1612 that has a function of controlling luminous of a light emitting element, and a first electrode (anode) 1613 that is connected to a drain of the current control TFT 1612.

On the both sides of the first electrode 1613, insulating layers 1614 are formed, and an organic compound layer 1615 is formed right on the first electrode 1613. Furthermore, a second electrode 1616 is formed on the organic compound layer 1615. In this way, a light emitting element 1618 composed of the first electrode (anode) 1613, the organic compound layer 1615 and the second electrode (cathode) 1616 is formed.

An auxiliary electrode 1617 is formed on the second electrode (cathode) 1616. And the auxiliary electrode 1617 is electrically connected to a connecting line 1617 and connecter through the FPC 1609 to an external power.

In order to encapsulate the light emitting element 1618 formed on the substrate 1610 airtightly, the encapsulating can 1604 is adhered to the substrate 1610 with the sealant 1605. A spacer made of a resin film may be set up to keep a given interval between the encapsulating can 1604 and the light emitting element 1618. An inert gas such as nitrogen is filled into the space 1607 inside the sealant 1605. As the sealant 1605, an epoxy resin is preferably used. The sealant 1605 is desirably made of a material through which water content or oxygen is transmitted as slightly as possible. In a part of the encapsulating can 1604, drying agent 1621 is provided in the space enclosed with the encapsulating can 1604 and a film 1620. The drying agent can absorb moisture in the space 1607 through the film 1620.

In this embodiment, the encapsulating can is used for encapsulating the substrate, there may be used as another encapsulating methods a glass substrate, a quartz substrate, or a plastic substrate made of fiber glass-reinforced plastic (FRP), polyvinyl fluoride (PVF), mylar, polyester or polyacrylic resin. After the adhesion of the encapsulating can 1604 to the substrate 1610 with the sealant 1605, a sealant is applied so as to cover the side faces (exposure faces).

As described above, the light emitting element is airtightly encapsulated in the space 1607, so that the light emitting element can be completely shut out from the outside and materials promoting deterioration of the organic compound layer, such as moisture and oxygen, can be prevented from invading this layer from the outside. Consequently, the light emitting device can be made highly reliable.

Embodiment 7

The element substrate shown in Embodiments 1 to 4 that is formed using the present invention can be used for the various semiconductor devices (active matrix liquid crystal display device, active matrix light emitting device, active matrix EC device, or the like) shown in Embodiment 5 or 6. Some electric appliances can be completed by being incorporated these display devices thereinto.

Given as examples of the electric appliances are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). In particular, in the case of the portable information terminal, use of the light emitting device is preferable, since the portable information terminal that is likely to be viewed from a tilted direction is often required to have a wide viewing angle. Specific examples of these electric appliance are shown in FIGS. 17A to 17H.

Figure 17A:
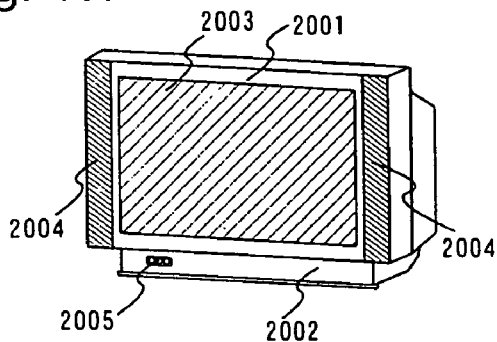
FIGS. 17A to 17H are diagrams showing examples of electric equipment.

FIG. 17A shows a display device, which is composed of a case 2001, a support base 2002, a display unit 2003, speaker units 2004, a video input terminal 2005, etc. The display device can be formed by applying the semiconductor device manufactured in accordance with the present invention to the display unit 2003. The display device refers to all display devices for displaying information, including ones for personal computers, for TV broadcasting reception, and for advertisement.

Figure 17B:
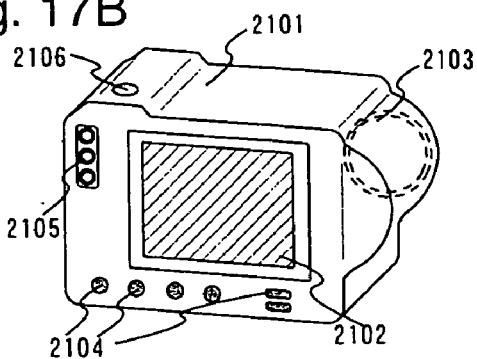

FIG. 17B shows a digital still camera, which is composed of a main body 2101, a display unit 2102, an image receiving unit 2103, operation keys 2104, an external connection port 2105, a shutter 2106, etc. The digital still camera can be formed by applying the semiconductor device manufactured in accordance with the present invention to the display unit 2102.

Figure 17C:
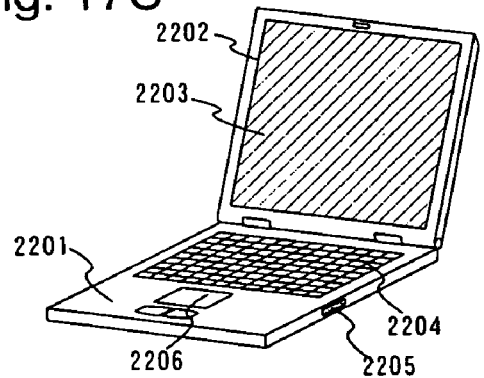

FIG. 17C shows a notebook personal computer, which is composed of a main body 2201, a case 2202, a display unit 2203, a keyboard 2204, an external connection port 2205, a pointing mouse 2206, etc. The notebook personal computer can be formed by applying the semiconductor device manufactured in accordance with the present invention to the display unit 2203.

Figure 17D:
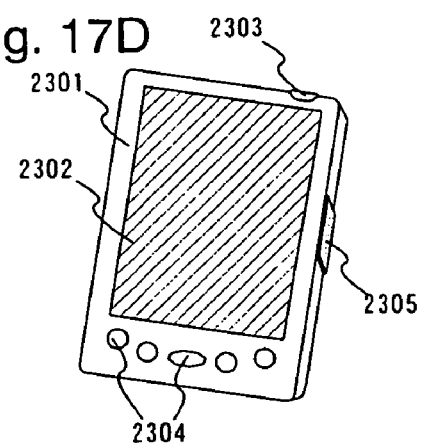

FIG. 17D shows a mobile computer, which is composed of a main body 2301, a display unit 2302, a switch 2303, operation keys 2304, an infrared port 2305, etc. The mobile computer can be formed by applying the semiconductor device manufactured in accordance with the present invention to the display unit 2302.

Figure 17E:
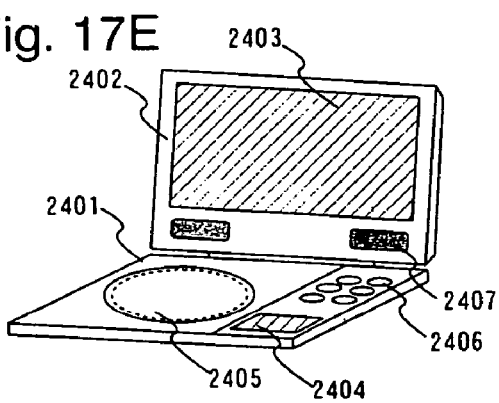

FIG. 17E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The portable image reproducing device can be formed by applying the semiconductor device manufactured in accordance with the present invention to the display unit A 2403 and the display unit B 2404. The image reproducing device equipped with a recording medium also includes home-video game machines.

Figure 17F:
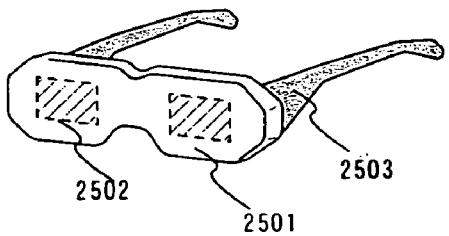

FIG. 17F shows a goggle type display (head mounted display), which is composed of a main body 2501, display units 2502, and arm units 2503. The goggle type display can be formed by applying the semiconductor device manufactured in accordance with the present invention to the display unit 2502.

Figure 17G:
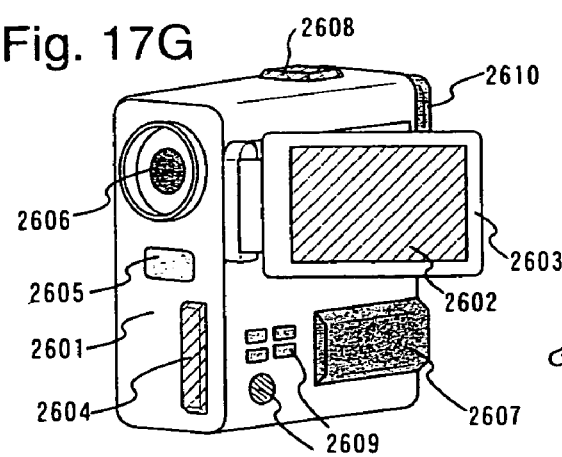

FIG. 17G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc.

The video camera can be formed by applying the semiconductor device manufactured in accordance with the present invention to the display unit 2602.

Figure 17H:
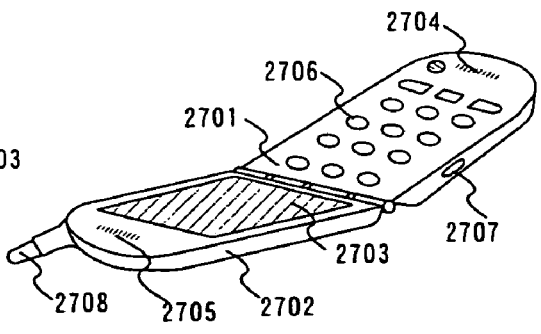

FIG. 17H shows a cellular phone, which is composed of a main body 2701, a case 2702, a display unit 2703, an audio input unit 2704, an audio output unit 2705, operation keys 2706, an external connection port 2707, an antenna 2708, etc. The cellular phone can be formed by applying the semiconductor device manufactured in accordance with the present invention to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

As described above, the application range of the semiconductor device manufactured by using the deposition device of the present invention is so wide that it is applicable to electric appliances of any field. The electric appliances of this embodiment can be implemented by freely combining any of Embodiments 1 to 6.

According to the present invention, in the case where the respective wirings (source wiring, drain wiring, and the like) are formed in the row direction and the column direction on the element substrate, one of the respective wirings in the row direction and the column direction is discontinuously formed at the portion where the wirings intersect with each other, and the insulating film is formed on the wirings. Thereafter, the connection wiring is formed of the same film as that for forming the electrode arranged on the insulating film through the opening portions (contact holes) formed in the insulating film. Thus, the discontinuous wirings are connected, thereby being capable of forming the continuous wiring. Therefore, the intersecting wiring can be formed while it is avoided that, in the prior art, the intersecting wiring is formed of a conductive film at a different layer. As a result, the number of steps is reduced, and the improvement in yield and the reduction in manufacturing cost can be realized.

What is claimed is:

1. A semiconductor device comprising:
    first and second semiconductor layers each comprising a source, a drain, and a channel region;
    a third semiconductor layer;
    a gate insulating film over the first, second, and third semiconductor layers;
    a source wiring and a current supply line over the gate insulating film;
    first and second gate electrodes over the gate insulating film, and overlapping channel regions of the first and second semiconductor layers through the gate insulating film, respectively;
    an insulating film over the source wiring, the current supply line, the first gate electrode, and the second gate electrode;
    plural connection wirings and a first electrode over the insulating film;
    an organic compound layer over the first electrode; and
    a second electrode formed over the organic compound layer,
    wherein the current supply line has a first width portion and a second width portion wider than the first width portion,
    wherein the third semiconductor layer and the second width portion of the current supply line overlap each other so that a capacitor is formed,
    the plural connection wirings are formed in opening portions formed in the insulating film and in the gate insulating film, and establish electrical connections between the source wiring and the source of the first semiconductor layer, between the drain of the first semiconductor layer and the second gate electrode, and between the current supply line and the source of the second semiconductor layer,
    wherein the first electrode is electrically-connected with the drain of the second semiconductor layer, and
    wherein the connection wirings and the first electrode are formed of the same material on the same film deposition surface.

2. A semiconductor device comprising:
    a current supply line;
    a first semiconductor layer comprising a source, a drain, and a channel region;
    a second semiconductor layer;
    a gate insulating film formed over the first and second semiconductor layers;
    a gate electrode over the gate insulating film, and overlapping with the channel region through the gate insulating film;
    an insulating film over the gate electrode;
    a connection wiring over the insulating film;
    a first electrode over the insulating film;
    an organic compound layer over the first electrode; and
    a second electrode formed over the organic compound layer,
    wherein the current supply line has a first width portion and a second width portion wider than the first width portion,
    wherein the second semiconductor layer and the second width portion of the current supply line overlap each other so that a capacitor is formed,
    wherein the first electrode is formed to contact with the first semiconductor layer,
    wherein the connection wiring establishes an electrical connection between the current supply line and the first semiconductor layer, and
    wherein the connection wiring and the first electrode are formed of the same material on the same film deposition surface.

3. A semiconductor device according to claim 1, wherein each of the connection wirings and the first electrode is formed to contact with at least one of the first, second, and third semiconductor layers.

4. A semiconductor device according to claim 1, wherein the connection wirings and the first electrode are formed of transparent conductive films.

5. The semiconductor device according to claim 1, wherein the semiconductor device is a liquid crystal display device.

6. A semiconductor device according to claim 2, wherein the semiconductor device is a liquid crystal display device.

7. A semiconductor device according to claim 1, wherein the semiconductor device is an organic electroluminescence display device.

8. A semiconductor device according to claim 2, wherein the semiconductor device is an organic electroluminescence display device.

9. A semiconductor device according to claim 2, wherein the connection wiring and the first electrode are formed of transparent conductive films.

* * * * *